US006405350B1

(12) United States Patent
Tawada

(10) Patent No.: US 6,405,350 B1
(45) Date of Patent: Jun. 11, 2002

(54) SYSTEM AND METHOD FOR IMPROVING CROSSTALK ERRORS VIA THE INSERTION OF DELAY GATES

(75) Inventor: Shigeyoshi Tawada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/116,333

(22) Filed: Jul. 16, 1998

(30) Foreign Application Priority Data

Jul. 18, 1997 (JP) ............................................. 9-209875

(51) Int. Cl.⁷ .............................................. G06F 17/50
(52) U.S. Cl. .................................... 716/5; 716/4; 716/6
(58) Field of Search ............................... 716/5, 8, 4, 6; 703/15, 4, 5, 13, 14, 16, 19

(56) References Cited

U.S. PATENT DOCUMENTS

| | | | | |
|---|---|---|---|---|
| 5,306,967 A | * | 4/1994 | Dow | 307/482.1 |
| 5,481,695 A | * | 1/1996 | Purks | 703/15 |
| 5,568,395 A | * | 10/1996 | Huang | 716/4 |
| 5,596,506 A | * | 1/1997 | Petschauer et al. | 716/5 |
| 5,808,502 A | * | 9/1998 | Hui et al. | 327/333 |
| 5,864,311 A | * | 1/1999 | Johnson et al. | 341/155 |
| 5,870,239 A | * | 2/1999 | Furuya | 360/55 |
| 6,028,989 A | * | 2/2000 | Dansky et al. | 716/8 |
| 6,145,116 A | * | 11/2000 | Tawada | 716/6 |

FOREIGN PATENT DOCUMENTS

| | | |
|---|---|---|
| JP | 2-238573 | 9/1990 |
| JP | 6-243197 | 9/1994 |
| JP | 7-135457 | 5/1995 |
| JP | 10-178100 | 6/1998 |

OTHER PUBLICATIONS

"CAD of Logic Devices", edited by Kozo Kinoshita, *Information Processing Society of Japan*, Mar. 20, 1981, pp. 31–62.

* cited by examiner

Primary Examiner—Vuthe Siek
(74) Attorney, Agent, or Firm—Sughrue Mion, PLLC

(57) ABSTRACT

For accomplishing a system for automatically improving and removing the crosstalk error for reducing the number of designing steps, the switching timing of each net is detected from the results of path delay analysis and crosstalk analysis is carried out so as to take account of the overlap of the switching timing between a net under inspection and a neighboring net. A delay gate insertion unit inserts a delay gate to a neighboring net having timing overlap with the net under inspection undergoing crosstalk error as detected or a net on a path to which belongs the neighboring net. The delay gate inserted is such a delay gate as can improve the crosstalk and as does not produce path delay error. The delay gate inserted by the delay gate placing unit is placed on the route of the net at such a position as can improve the crosstalk error of the net under inspection. An incremental wiring unit re-wires a net divided by the insertion and placing of the delay gate and a net affected by the insertion and placing of the delay gate to improve the crosstalk error automatically.

12 Claims, 18 Drawing Sheets a, b : NEIGHBORING DOMAIN (Lj)
c, d : NEIGHBORING DISTANCE (Wj)

SYSTEM AND METHOD FOR IMPROVING CROSSTALK ERRORS VIA THE INSERTION OF DELAY GATES

FIELD OF THE INVENTION

This invention relates to system and a method for improving crosstalk errors such as LSI or PWB (printed wiring board).

DESCRIPTION OF THE RELATED ART

As prior-art publications pertinent to the present invention, reference is made to the following publications:

(1) JP Patent Kokai JP-A-7-135457; and
(2) "CAD of Logic Devices", edited by Kozo Kinoshita, IPSJ(Information Processing Society of Japan), issued Mar. 20, 1981, pages 31 to 62.

If, in the prior-art placing system, the wiring pitch is of a large magnitude, it has been unnecessary to take account of the cross-talk by the neighboring wiring. However, as the wiring becomes finer in pitch with pattern miniaturization, the effect of the crosstalk becomes non-negligible. Thus, after end of the placing and wiring, the cross-talk by the neighboring wiring is calculated to make cross-talk analysis to effect manual correction of the net itself which has caused the crosstalk errors or the wiring pattern of the neighboring net responsible for crosstalk.

Alternatively, the wiring connection designing is manually preliminarily adjusted to preclude an elongated net liable to cause crosstalk errors or superfluous repeater buffers are inserted during logical designing to preclude the occurrence of an unnecessarily long net liable to the effect of crosstalk.

In the wiring designing, automatic wiring means have also been used to suppress occurrence of crosstalk errors for controlling line length for preventing the wiring route of each net from exceeding a pre-set linear length.

SUMMARY OF THE DISCLOSURE

However, the above-described techniques suffer from the following drawbacks:

The first drawback is that, after detecting the crosstalk error, the resulting wiring of the net or the neighboring net need to be corrected manually.

The reason is that not only is a large number of manual wiring correction steps required, but also the net to be corrected has a long wiring length itself, so that, depending on the degree of wiring congestion, the wiring correction by itself is insufficient to remove and improve the crosstalk error.

The second drawback is that a manual placing and wiring designing needs to be adjusted preliminarily to eliminate crosstalk errors.

The reason is that a large number of laborious steps are required for the manual placing and wiring operation and the layout (floor plan) needs to be taken into account since the time of logical designing, thus placing limitations on designing to increase designing difficulties to result in a newly increased number of steps.

The third drawback is that excess repeater buffers are inserted during logical designing.

The reason is that the numerous steps required for logical correction and excess repeater buffers worsen the routability or increase the power consumption.

As a fourth drawback there is a problem caused in case where the occurrence of the crosstalk error is suppressed using automatic wiring means which effectuates line length control to prevent the wiring route of each net in the wiring designing from exceeding a pre-set linear wiring length.

That is, since the wiring length of the net itself is long so that, depending on the degree of wiring congestion, there are occasions wherein the limitation on the wiring length alone is insufficient to eliminate or improve the crosstalk error, or the bending or detour of the wiring occurs to the extent more than is necessary to worsen the routability.

It is therefore an object of the present invention to provide a more accurate system and method for improving the crosstalk error whereby the amount of the crosstalk can be calculated only for the net under inspection liable to affect neighboring nets by taking into account the switching timing in detecting the crosstalk errors.

It is another object of the present invention to provide a system and method in which a delay gate is inserted partway on the wiring route of a neighboring affected net or a net on the path to which belongs the neighboring net, among the nets found to be undergoing crosstalk error by the results of layout of usual placing and wiring, to shift the timing to reduce the number of manual correction steps of the crosstalk error for improving the crosstalk error.

A further object of the present invention is as follows: That is, if the crosstalk error is to be improved only by the correction of the wiring route of the net, there are occasions wherein the error cannot be eliminated or improved depending on the degree of the wiring congestion if the wiring length of the net to be corrected is long, whereas, with the method of delaying the timing of the neighboring net by the delay gate, the wiring congested portion can be evaded thus increasing the possibility of improvement in the crosstalk error.

It is also necessary to prevent the routability from being lowered or to prevent the power consumption from being increased as a result of the insertion of excess repeater buffers during logical designing.

It is also necessary to overcome the limitations on the removal and improvement of the crosstalk error in the wiring congestion area and to suppress routability otherwise caused by bending of the wiring to an extent more than is necessary or detour in case of using automatic wiring means controlling the line length to prevent the net wiring route from being placed in excess of a pre-set line length.

There is provided a system for automatically improving and removing the crosstalk error for reducing the number of designing steps.

The switching timing of each net is detected from the results of path delay analysis and crosstalk analysis is carried out so as to take account of the overlap of the switching timing between a net under inspection and a neighboring net. A delay gate insertion unit inserts a delay gate to a neighboring net having timing overlap with the net under inspection undergoing crosstalk error as detected or a net on a path to which belongs the neighboring net. The delay gate inserted is such a delay gate as can improve the crosstalk and as does not cause path delay error. The delay gate inserted by the delay gate placing unit is placed on the route of the net at such a position as can improve the crosstalk error of the net under inspection. An incremental wiring unit re-wires a net divided by the insertion and placing of the delay gate and a net affected by the insertion and placing of the delay gate to improve the crosstalk error automatically.

In an aspect of the present invention, there is provided a crosstalk error improving system comprising:

(a) means for detecting switching timing of each net from the results of path delay analysis to execute crosstalk analysis which takes into account overlap of the switching timing of the net under detection with a neighboring net;

(b) means for inserting a delay gate into a neighboring net having timing overlap with the net under detection undergoing crosstalk error with the net under detection or with a net on a path to which belongs the neighboring net, said delay gate being capable of improving the crosstalk error without causing a path delay error;

(c) means for placing the inserted delay gate at a position on the route of the net capable of improving the crosstalk error of the net under detection; and (d) means for re-wiring the net divided by the insertion and placing of the delay gate and an affected net.

In a second aspect of the present invention, there is provided a crosstalk error improving system comprising, in a layout designing for LSI or PWB. The system comprises:

(a) logical/library inputting means for inputting:
 logical connection information between blocks making up a circuit,
 physical information of block placing results and/or inter-block connection wiring results,
 delay library information comprising parameters for calculating block internal delay and/or wiring delay required for delay analysis, and
 library information for crosstalk analysis comprising parameters for calculating crosstalk magnitude required for crosstalk analysis;

(b) path delay limit value inputting means for inputting path delay time limit value, which comprises minimum delay time limitation and/or maximum delay time limitation, prescribing a target performance of the circuit;

(c) crosstalk magnitude limit value inputting means for inputting a crosstalk magnitude limit value of a net for assuring normal circuit operation;

(d) path delay analysis means for performing delay analysis of all or part of paths;

(e) net switching timing detection means for finding, from the results of the delay analysis, the minimum/maximum time since the clock input time until signal propagation to a net, that is the time during which net switching is likely to occur;

(f) timing overlap detection means for detecting, for all or part of the nets, referred to as "net under detection", an overlap of the switching timing between the net under detection and a net having a wiring neighboring to the wiring of the net under detection, referred to as "neighboring net";

(g) crosstalk analysis means for calculating, using the library information for crosstalk analysis, crosstalk magnitude to the net under detection from the neighboring net having timing overlap as detected by the timing overlap detection means, to detect the net subjected to the crosstalk error;

(h) delay gate inserting means for inserting at least one delay gate, into a net under detection undergoing crosstalk error or a net on a path to which belongs the neighboring net having timing overlap with the net under detection so as to eliminate the timing overlap, said delay gate being capable of satisfying the delay time limitations of a path to which belongs the neighboring net for improving the crosstalk error;

(i) delay gate placing means for placing a delay gate, that has been inserted into the neighboring net or in the net on the path to which belongs the neighboring net by the delay gate inserting means, at a position on the route of the real wiring result of the net or at a near-by possible placing position, the position being capable of improving the crosstalk error with the net under detection;

(j) incremental wiring means for making re-wiring of the net divided by the inspection and placing of the delay gate and other nets affected by the insertion and placing of the delay gate;

(k) outputting means for outputting the placing wiring results; and (l) control means for controlling all of said means.

According to a third aspect, crosstalk error improving system further comprises:

(m) delay buffer placing means for placing the delay gate inserted by said delay gate inserting means at a position capable of improving the crosstalk error in an overlapping manner to allow for placing errors, instead of searching for a near-by possible placing position, even if there exists other block(s) at the intended placing position; and (n) placing error eliminating means for shifting the placing of the block to eliminate the overlap in case the delay gate placed by said delay gate placing means undergoes a placing error.

In a fourth aspect, the delay gate inserting means (h) comprises means for selecting, inserting, placing and wiring two stages of delay inverter gates as a set instead of said delay gate.

In a fifth aspect, the crosstalk error improving system comprises:

instead of (i) said delay gate placing means and (j) said incremental wiring means, (o) same-direction-switching net detection means for detecting the neighboring net having timing overlap with the net under detection and which is switched at all times in the same direction as the net under detection;

(p) inverter gate inserting means for inserting two inverter gates in the neighboring net detected by said same-direction-switching net gate detection means;

(q) inverter gate placing means for placing the inverter gate, inserted into the neighboring net by the inverter gate inserting means, at the positions representing the starting/end points of the parallel wiring domain with the net under detection on the route of the real wiring results of the net or in the near-by possible placing position; and (r) incremental re-wiring means for re-wiring the wiring of a net divided by the insertion and placing of said inverter gate and the wiring of other nets affected by the insertion and placing of the inverter gate.

In a sixth aspect, the crosstalk error improving system comprises:

instead of said (q) inverter gate placing means, (qq) inverter gate placing means for placing the inverter gates, inserted into the neighboring net by the inverter gate inserting means, at the positions representing the starting/end points of the parallel wiring domain with the net under detection on the route of the real wiring results of the net or in the near-by possible placing position, provided that said inverter gate placing means places the inverter gate with an overlap to allow for placing error without searching for a near-by possible placing position even if other blocks are present in the intended placing position; and (s) placing error eliminating means for shifting the placing of a block for eliminating an overlap if the inverter gate placed by said inverter gate placing means undergoes a placing error.

PREFERRED EMBODIMENTS OF THE INVENTION

In the following, preferred embodiments of the present invention are explained. In a preferred form of the present invention, net switching timing detection means (106 of FIG. 1) finds, from the results of the delay analysis by the path delay analysis means (105 of FIG. 1), the switching timing of each net, and timing overlap detection means (107 of FIG. 1) detects, for each net or part of the nets (net under detection), an overlap of the switching timing between the net under detection and any net (or nets) having a wiring neighboring to the wiring of the net under detection (neighboring net or nets). On the other hand, the crosstalk analysis means (108 of FIG. 1) calculates, using the library information for crosstalk analysis, the crosstalk magnitude to the net under detection from the neighboring net having timing overlap as detected by the timing overlap detection means, to detect the net subjected to the crosstalk error; and delay gate insertion means (109 of FIG. 1) inserts at least one delay gate into a net under inspection undergoing crosstalk error or a net on a path to which belongs the neighboring net having timing overlap with the net under inspection so as to eliminate the timing overlap. The delay gate is capable of satisfying the delay time limitations of a path to which belong the neighboring net for improving the crosstalk error. In addition, delay gate placing means (110 of FIG. 1) places a delay gate, that has been inserted into the neighboring net or in the net on the path to which belongs the neighboring net by the delay gate inserting means, at a position on the route of the real wiring result of the net or at a near-by possible placing position, the positions being capable of improving the crosstalk error with the net under inspection. Incremental wiring means (111 of FIG. 1) makes re-wiring of the net divided by the insertion and placing of the delay gate and other nets affected by the insertion and placing of the delay gate (e.g., causing a design rule error such as shorting of wires) for automatically improving the crosstalk error. In the preferred form of the present invention, the above means can be implemented by a program executed on, for example, a computer.

In a preferred second form of the present invention, in case where repeater buffer placing means places the inserted repeater buffer at a position capable of improving the crosstalk error, it places the repeater buffer in an overlapping manner to allow for placing errors, instead of searching for a near-by placing enabling position, even if there exists other block(s) at the intended placing position, and placing error removing means (1511 of FIG. 15) shifts the placing of the block(s) for eliminating the overlap in case the placed repeater buffer undergoes a placing error for enabling the repeater buffer to be placed at an ideal placing position to improve crosstalk error to higher precision.

In a preferred second form of the present invention, when repeater buffer placing means places the inserted repeater buffer at a position capable of improving the crosstalk error, it places the repeater buffer in an overlapping manner to allow for placing errors, instead of searching for a near-by placing enabling position, even if there exists other block(s) at the intended placing position, and placing error removing means (1511 of FIG. 15) shifts the placing of the block for eliminating the overlap in case the placed repeater buffer undergoes a placing error for enabling the repeater buffer to be placed at an ideal placing position to improve crosstalk error to higher precision.

In the preferred third form of the present invention, two stages of delay inverter gates as a set are selected, inserted, placed and wired instead of the delay gate.

That is, the placing of the delay gate/delay inverter gate(s) and the wiring of the related net(s) are made on the basis of the actual placing wiring result taking into account the overlap of the switching timing of the signal and the signal changing direction, thus realizing crosstalk error improvement to high precision.

In a fourth preferred form of the present invention, same-direction-switching net detection means (1808 of FIG. 18) detects, among neighboring nets having timing overlap with the net under inspection, a neighboring net which has timing overlap with the net under inspection and which is switched at all times in the same direction as the net under inspection. Inverter gate inserting means (1810 of FIG. 18) inserts two inverter gates in the neighboring net detected by the same-direction-switching net gate detection means. Inverter gate placing means (1811 of FIG. 18) places the inverter gates, inserted in the neighboring net by the inverter gate inserting means, on the positions representing the starting/end points of a real wiring domain parallel with the net under detection on the route of the real wiring result of the net or in the near-by placeable position. Then incremental wiring means (1812 of FIG. 18) re-wires the wiring of a net divided by the insertion and placing of the inverter gates and the wiring of other nets affected by the insertion and placing of the inverter gates, that is the wiring of other nets subjected to designing rule error such as wiring shorting. This enables the crosstalk to be improved to high precision.

In a fifth preferred form of the present invention, inverter gate placing means lays the inverter gates, inserted in the neighboring nets by the inverter gate inserting means, on the positions representing the starting/end points of the real wiring domain parallel with the net under detection on the route of the real wiring result of the net or in the near-by placeable position. The inverter gate placing means places the inverter gate with an overlap to allow for placing error, without searching for a nearby possible placing position, even if other blocks are present in the intended placing position. The placing error eliminating means shifts the placing of a block for eliminating an overlap if the inverter gates placed by the inverter gate placing means undergo a placing error, thus enabling the crosstalk error to be improved to higher precision.

That is, the placing of the delay gate/delay inverter gates and the wiring of the related net(s) are made on the basis of the actual wiring results taking into account the overlap of the switching timing of the signal and the signal switching direction, thus realizing crosstalk error improvement to high precision.

EXPLANATION OF NUMERALS 202, 203, 206, 207, . . . gates; 201, 204, 205, 208, . . . flip-flops; 209 to 222, . . . nets.

DETAILED DESCRIPTION OF THE PREFERRED EMBODIMENTS

Figure 1:
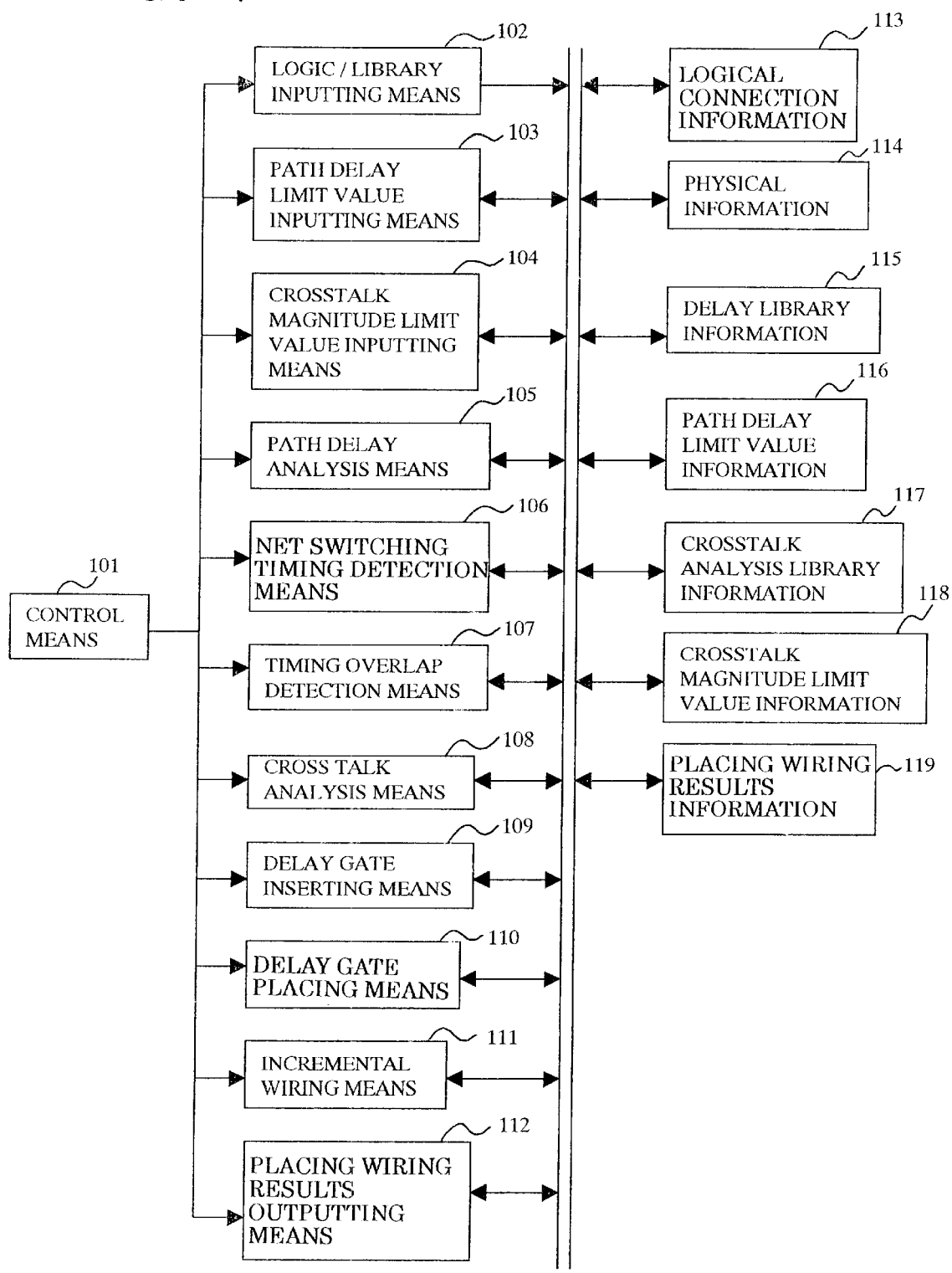
FIG. 1 is a block diagram of the crosstalk error improvement system according to an embodiment of the present invention.

FIG. 1 shows a block diagram of a crosstalk error improvement system according to an embodiment of the present invention.

In the following explanation, a portion of a logical connection composed of gates 202, 203, 206 and 207, flip-flops 201, 204, 205 and 208 and nets 209 to 222 interconnecting the blocks is taken as an example. Although the present embodiment shows a portion of the logical connection, the placing and wiring operation is carried out for the entire logical connection.

Figure 3:
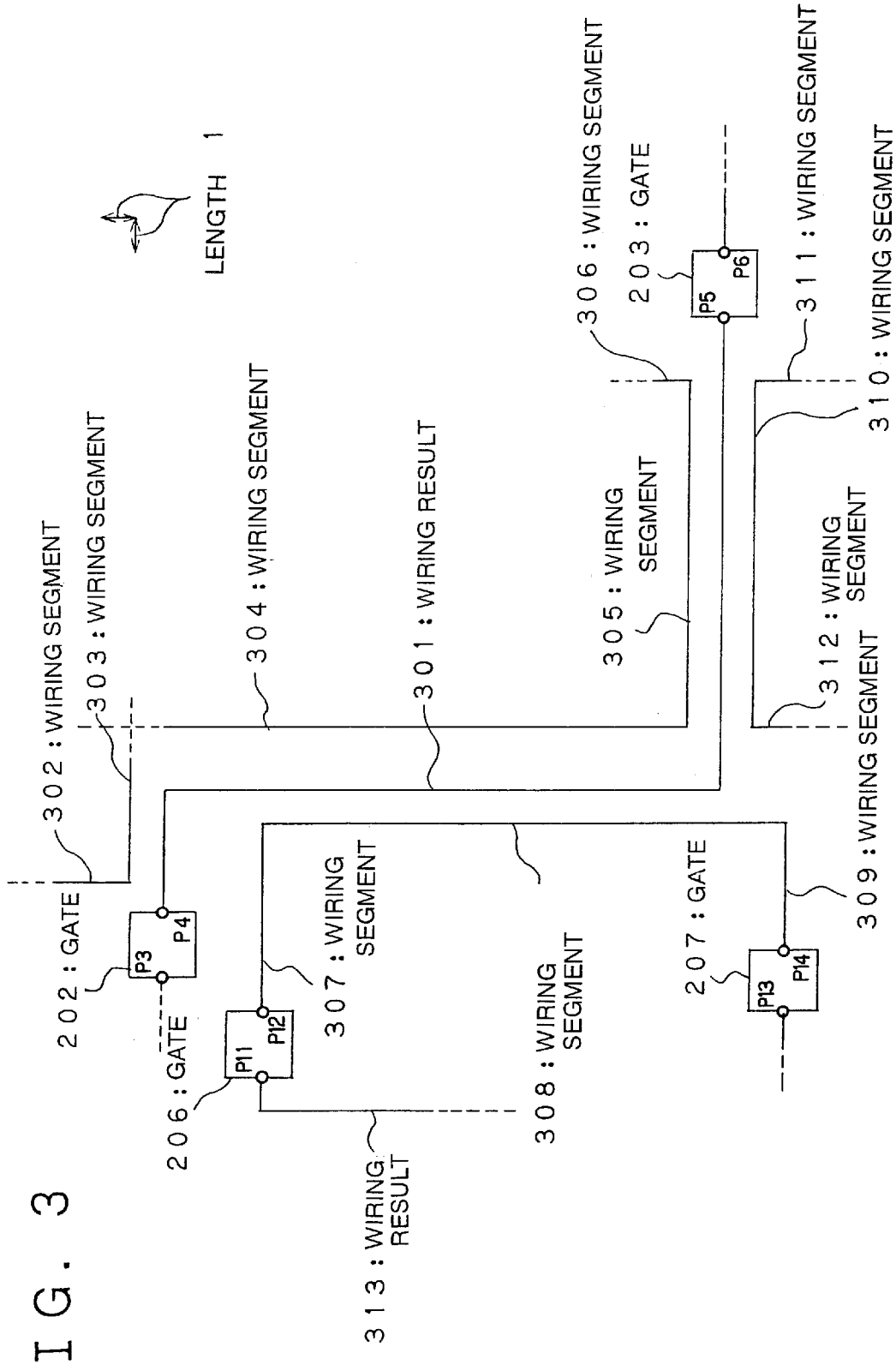
FIG. 3 shows an example of the placing wiring results by the conventional technique on the logical connecting information of FIG. 2.

It is assumed that the placing and wiring results shown for example in FIG. 3 is obtained as a result of the placing and wiring operation employing the conventional layout technique. In the conventional technique, the limitation in the magnitude of crosstalk is not particularly considered.

In general, the crosstalk magnitude ($V_N$) of a net (N) is represented by a monotonous increasing function (f) which has, as an argument, the sum($\Sigma C_j$) of the fringe capacitance ($C_j$) for a wiring segment (j) neighboring to the net.

$$V_N = f(\Sigma C_j) \quad (1)$$

Figure 4:
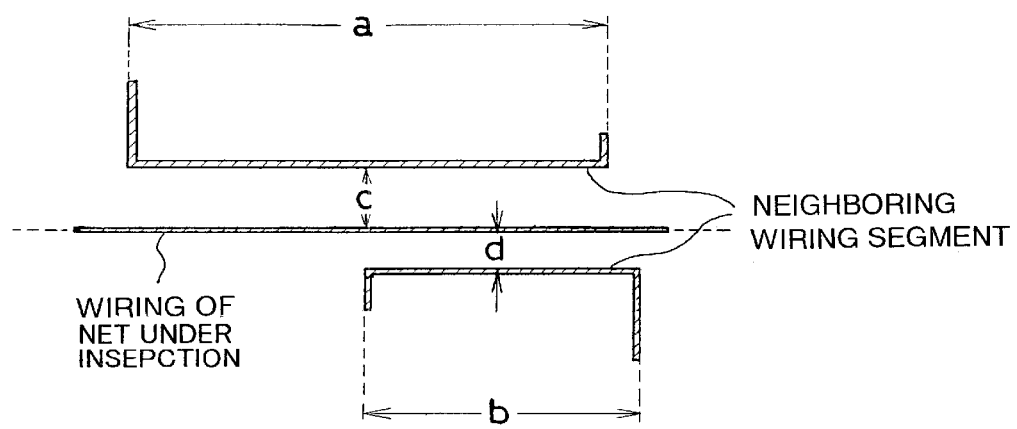
FIG. 4 illustrates an embodiment of the present invention for showing a net for crosstalk analysis (net under inspection) and a neighboring wiring segment.

The fringe capacitance is a function (g) which monotonously increases with respect to the neighboring domain ($L_j$) between the net and the wiring segment and which monotonously decreases with respect to the neighboring (distance separation)($W_j$) between the net and the wiring segment. The neighboring domain and the neighboring distance are shown in FIG. 4.

$$C_j = g(L_j, W_j) \quad (2)$$

The effect of the crosstalk manifests itself only when the neighboring net (or the wiring segment) is switched at the same time and in the same direction as the net under inspection.

Thus, for decreasing the crosstalk magnitude of a net, it is necessary to (a) decrease the number of neighboring segments themselves;

(b) shorten the length of the neighboring domain of the neighboring wiring segment; and (c) increase the neighboring distance to the wiring segment; and (d) to avoid the switching of the neighboring nets (or wiring segments) at the same time and in the same direction.

For simplifying the explanation, the equations (1) and (2) are approximated by the following simple equations (3) and (4):

$$i \ f(\Sigma C_j) = \beta \cdot \Sigma C_j \quad (3)$$

$$g(L_j, W_j) = \gamma \cdot L_j / W_j \quad (4)$$

where $\beta$ and $\gamma$ are coefficients.

Specifically, it is assumed that VN is proportionate to $\Sigma C_j$ while $C_j$ is proportionate to $L_j$ and inversely proportionate to $W_j$. Then the crosstalk magnitude is given by the following equation:

$$V_N = \beta \cdot \Sigma C_j = \beta \cdot \Sigma (\gamma \cdot L_j / W_j) = \alpha \cdot \Sigma (L_j / W_j)$$

where $\alpha = \beta \cdot \gamma + tm$ (5)

It is assumed that, in the example of FIG. 3, each unit frame or square has a side length in the vertical direction and a side length in the horizontal direction equal to 1 and that the inter-wiring capacitance needs to be found with the wiring segment having neighboring distance equal to 3 or less. It is also assumed that all of the wiring segments 303, 304, 305, 307, 308 and 310 neighboring to the wiring results 301 of the net 211 are likely to be switched at the same time and in the same direction as the net 211.

Figure 5:
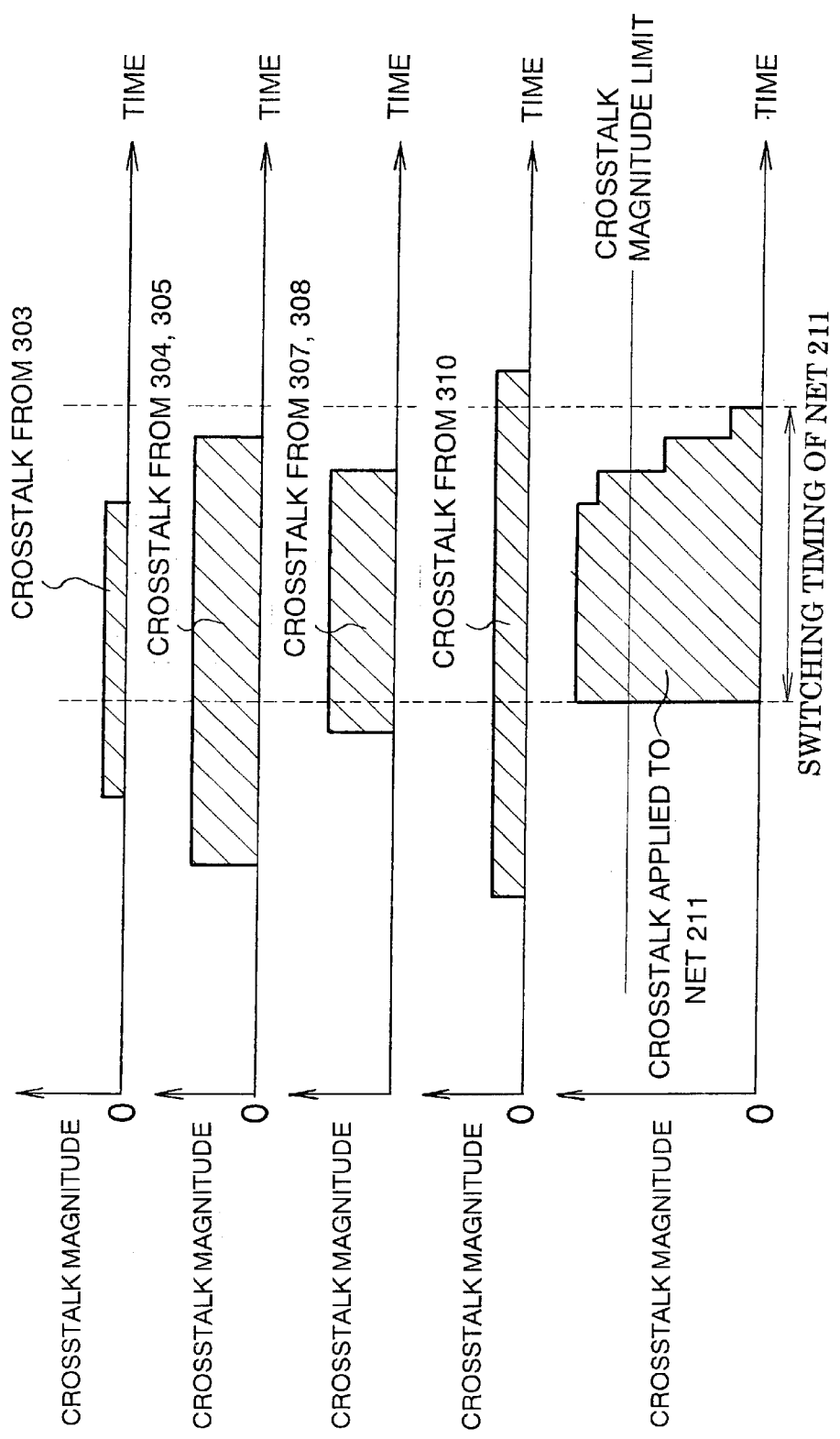
FIG. 5 is a graph showing the switching timing and the crosstalk of a neighboring net in the placing wiring results of FIG. 3 and the switching timing and the crosstalk of the net under inspection.
Figure 6:
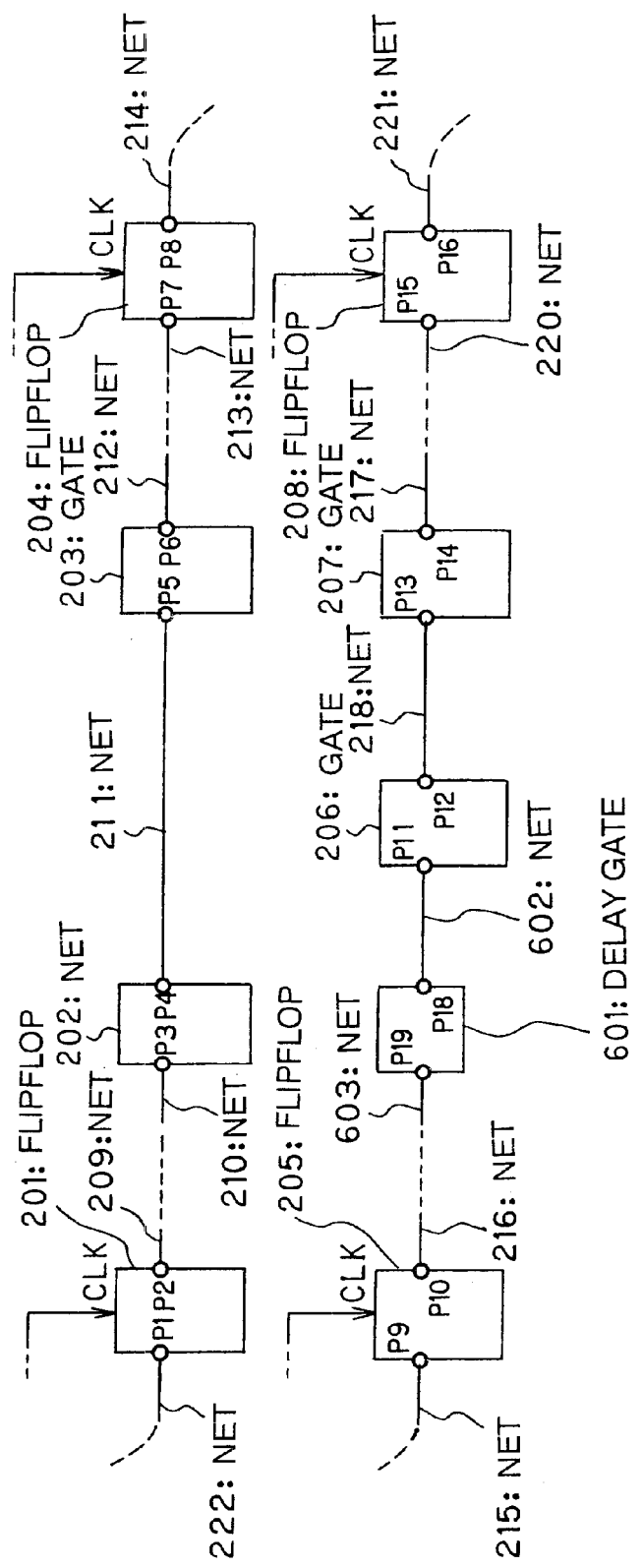
FIG. 6 illustrates an embodiment of the present invention for showing an example of the logical connection information for the results of insertion of a delay gate by delay gate insertion means.

That is, if assumed that there is an overlap in the switching timing as shown in FIG. 5, the sum of the inter-wiring capacitance between the neighboring wiring segments 303, 304, 305, 307, 308 and 310 is substituted into the following equation (6):

$$V211 = \alpha \cdot (L303/W303 + L304/W304 + L305/W305 + L307/W307 + L308/W308 + L310/W310) = \alpha \cdot (3/1 + 16/2 + 11/1 + 3/3 + 14/1 + 11/1) = 48\, \alpha \quad (6)$$

in order to find the maximum value of the crosstalk magnitude applied to the net 211.

If the limitation on the crosstalk magnitude of the net is, for example, 40α, the net 211 is subjected to the crosstalk error.

In the preset embodiment of the crosstalk error improving system, each means is executed under control by the control means 101 as follows:

Referring to FIG. 1, logic/library inputting means 102 first enters the logical connection information between blocks 113, physical information 114 and placing/wiring results information 119 such as block placing results or wiring results of the inter-block connection, delay library information 115 such as parameters for calculating the inner delay or wiring delay in the block as required for delay analysis for the wiring delay, and the library information for crosstalk analysis 117. The information, thus entered, is referred to/updated by respective means. As the wiring result data, the results placed out by the conventional technique, as an example, as shown in FIG. 3, is entered.

The path delay limit value inputting means 103 then enters the delay limit value information 116, while crosstalk magnitude limit value inputting means 104 enters the crosstalk magnitude limit value 118. Here, 40α is entered as the crosstalk magnitude limit value for the net 211.

The path delay analysis means 105 then analyzes the delay of all paths. Based on the results of the analysis, the net switching timing detection means 106 then finds the net switching timing of all nets. The net switching timing denotes the time interval between the time the signal being propagated reaches an input terminal of the net (minimum time) and the time until the signal reaches the output terminal of the net (maximum time) and denotes the time during which the switching operation of the net is likely to occur, with the time of inputting of the clock signal in the flip-flop, as a starting point for all paths traversing the path, being zero.

In FIG. 5, a horizontally extending interval of the graph showing the crosstalk magnitude represents the switching timing of the net (which is defined by the wiring segment of the net in the drawing).

Referring to FIG. 1, crosstalk analysis means 108 finds peak values of the crosstalk magnitude from the neighboring net experiencing overlap (wiring segment) as shown in FIG. 5 to analyze the crosstalk of all nets in consideration of the overlap of the switching timing with the neighboring net.

As a result of the above-described crosstalk analysis, which takes the switching timing into account, the sum of crosstalks from the wiring segments of all the neighboring nets becomes a peak magnitude, with a crosstalk magnitude being 48α (>40α: limit value), thus detecting the crosstalk error of the net 211.

Referring again to FIG. 1, the delay gate insertion means 109 selects such one among the neighboring nets causing crosstalk, that can eliminate the effect of the crosstalk by shifting the switching timing, in order to reduce the crosstalk magnitude to the net 211 causing the crosstalk error, and inserts a delay gate into a path to which the net belongs in order to shift the switching timing of the net. This operation is repeated until the error is annulled.

Figure 2:
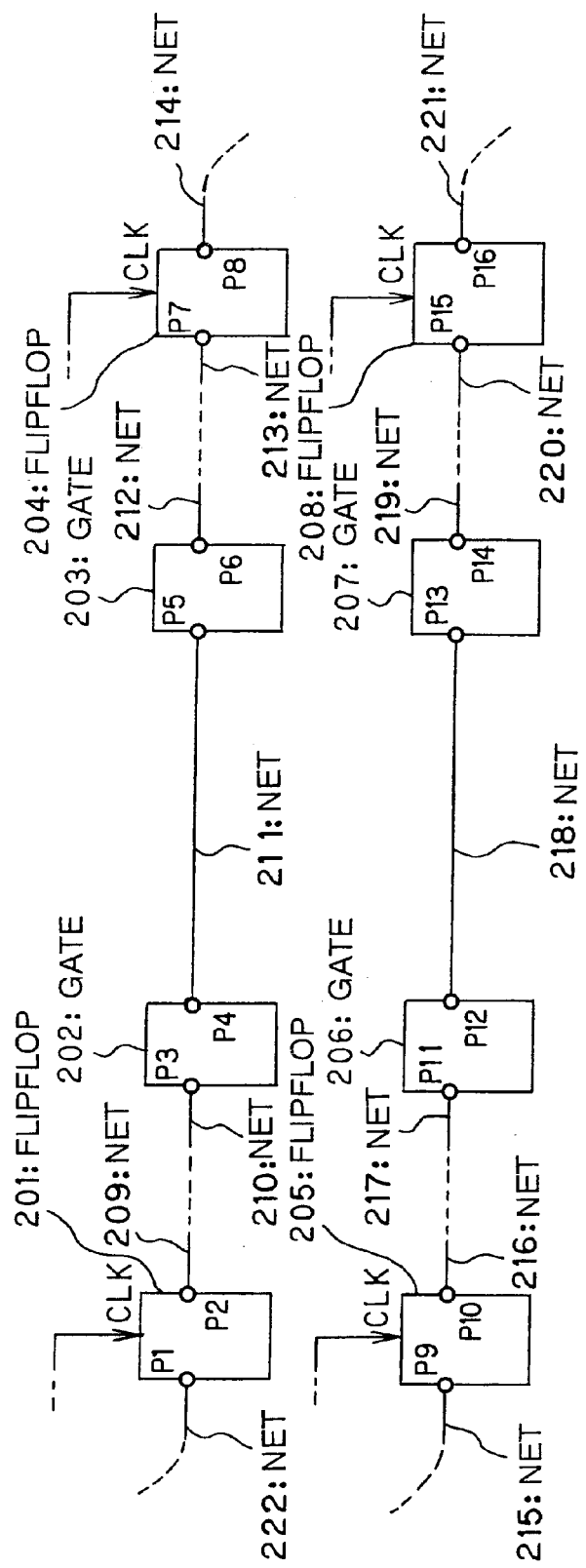
FIG. 2 illustrates an embodiment of the present invention for showing an example of the logical connecting information.
Figure 7:
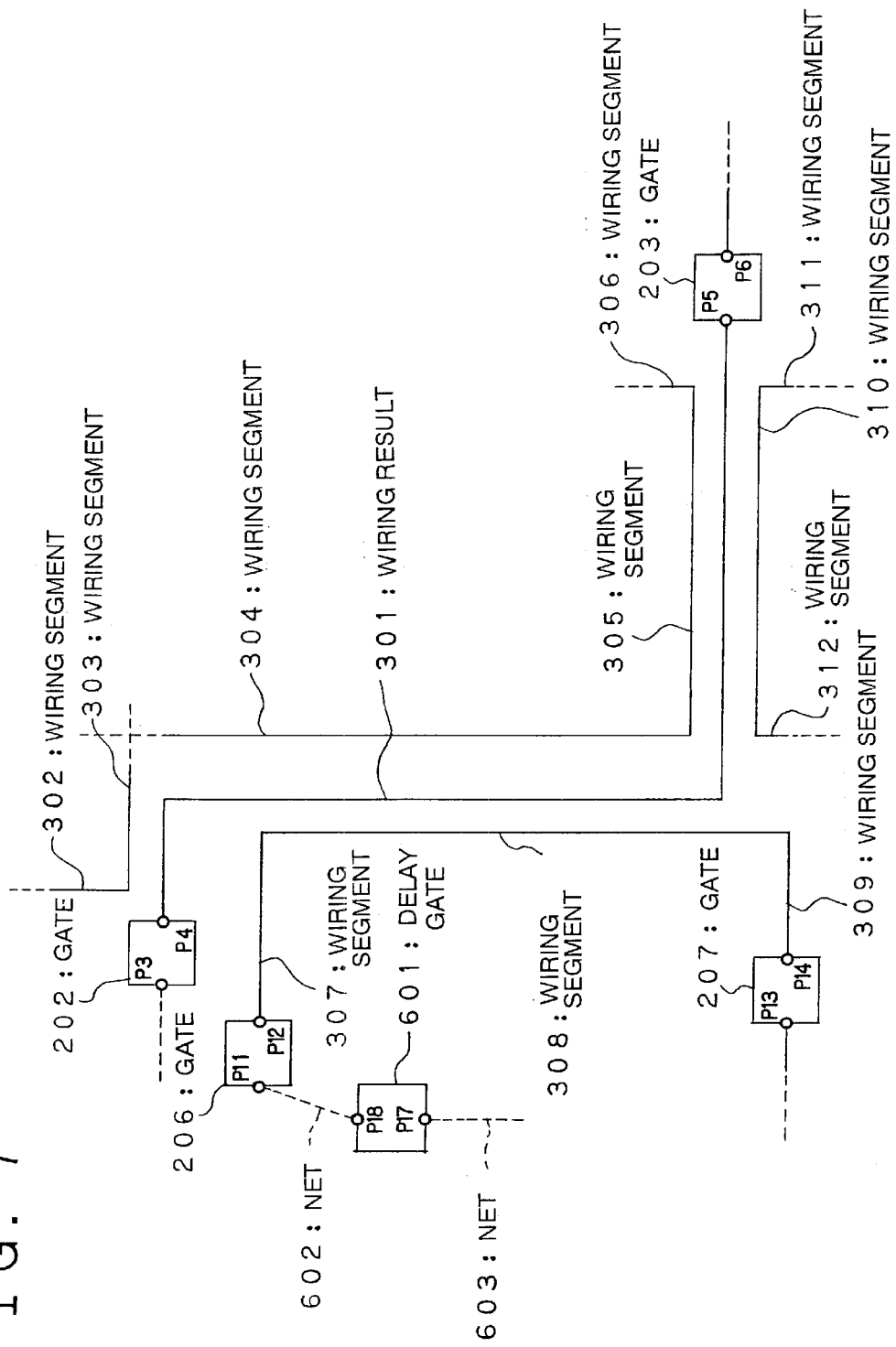
FIG. 7 illustrates an embodiment of the present invention for showing an example of the wiring results by incremental wiring means for the wiring results of FIG. 7.

In this case, a delay gate 601 is selected and inserted in the input side net 217 of the gate 206, as shown in FIG. 7, in order to eliminate the crosstalk from the wiring segments 307, 308 of FIG. 5 (these belonging to the net 218 of FIG. 2). This divides the net 217 into 602 and 603.

An optimum one or more of delay gate types ("delay gate types" refer to names of the functions of the delay gates) placed in store is selected and inserted. The selection step is carried out at the same time as verification by delay analysis means 105 so as to inhibit contravention of the path delay time limitation due to delay gate insertion. Based on the results of insertion, the logical connection information 113 is updated and the wiring results 313 of the net 217 (see FIG. 3) are deleted, while only the route information is kept in the placing wiring results information 119.

The delay gate placing means 110 then places the delay gate 601, inserted by the delay gate inserting means 109, in a possible placing area, (layable area) in the vicinity of the insertion candidate position on the route of the deleted wiring result 313, held on memory, to give a placing result of the delay gate 601 as shown in FIG. 7.

Although there is no wiring of other nets in the placing position of the delay gate 601 in an example of FIG. 7, it is noted that, if conversely there is a wiring of other nets, such wiring as will cause wiring shorting or contravention to wiring inhibition is deleted simultaneously.

Figure 8:
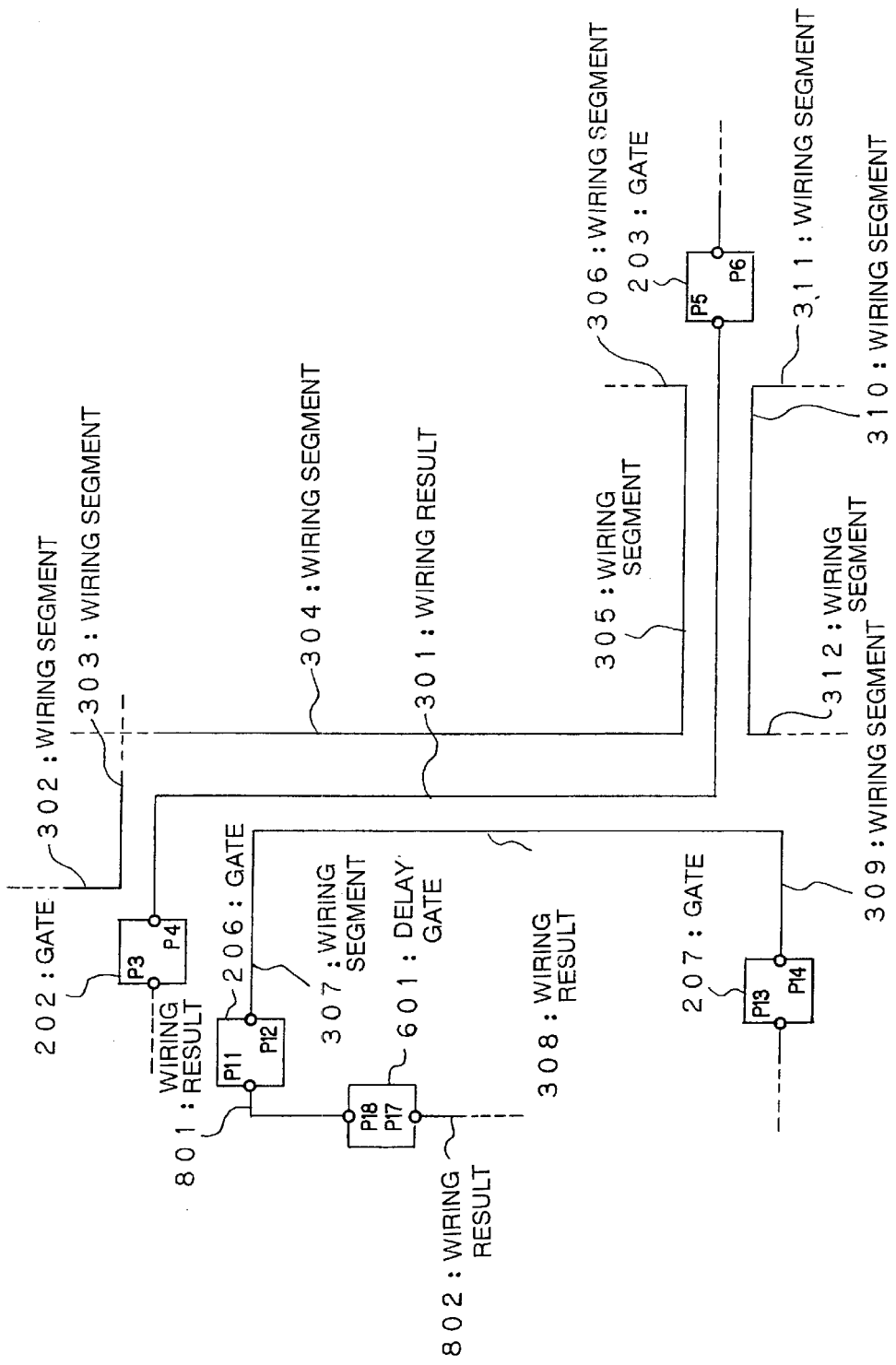
FIG. 8 illustrates an embodiment of the present invention for showing an example of the wiring results by the incremental wiring means for the wiring results of FIG. 7.

Then, incremental wiring means 111 lays the wiring for 602, 603 as a non-wired net, in order to give the targeted wiring results 801, 802 in which the crosstalk error is improved, herein eliminated, as shown in FIG. 8.

Figure 9:
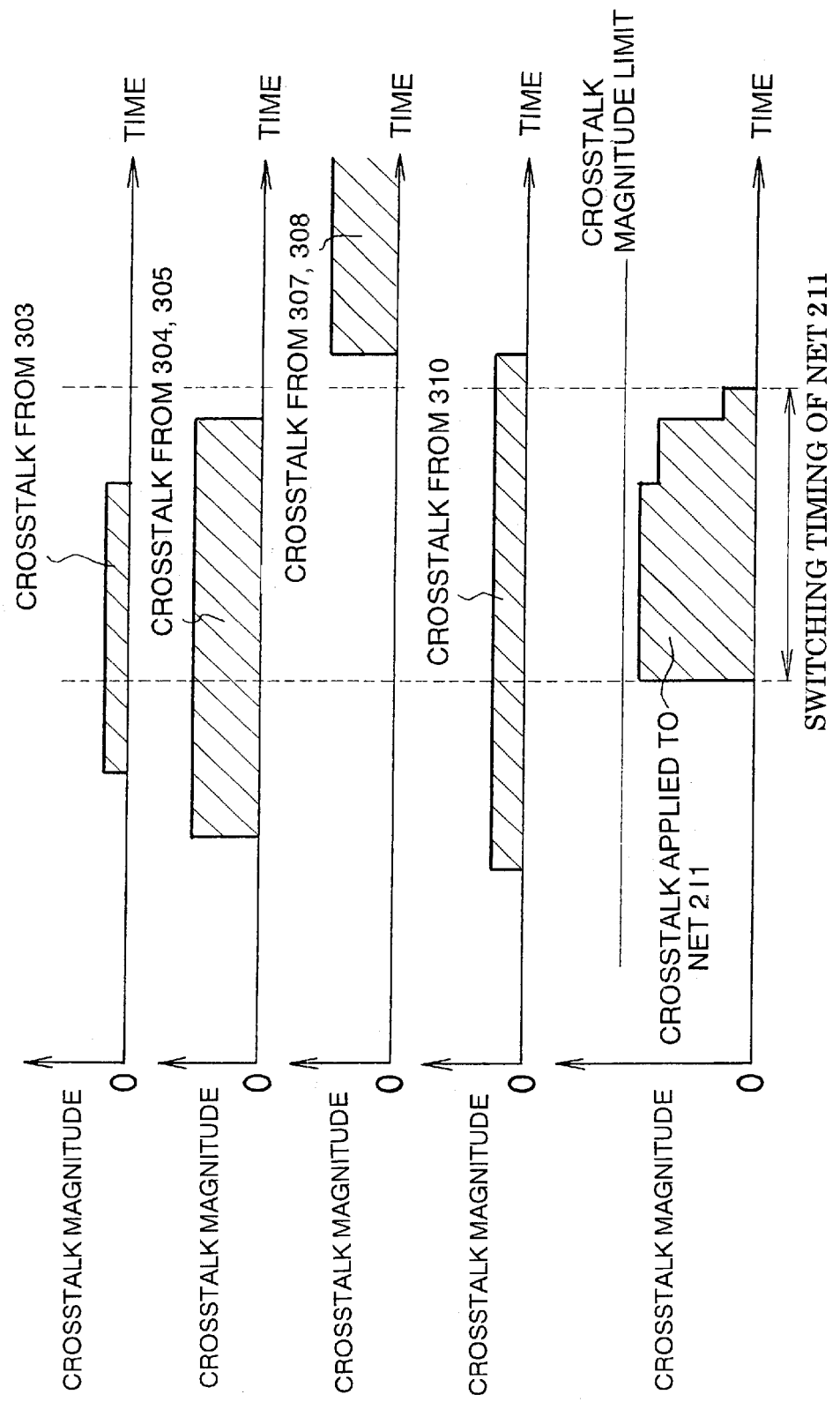
FIG. 9 illustrates an embodiment of the present invention for showing the switching timing of neighboring nets and the crosstalk magnitude from the neighboring nets in the wiring results of FIG. 8 versus the switching timing and crosstalk of the net under inspection.

FIG. 9 shows the switching timing of the placing and wiring results of FIG. 8 and the magnitude of the crosstalk applied to the net 211. It is seen that, as a result of insertion of the delay gate 601, the switching timing of the wiring segments 307, 308 is shifted such that the maximum value of the crosstalk magnitude is less than the crosstalk magnitude limitation value of 40α to eliminate the error, as shown by the following equation (7):

$$V211 = \alpha \cdot (L303/W303 + L304/W304 + \qquad (7)$$
$$L305/W305 + L310/W310)$$
$$= \alpha \cdot (3/1 + 16/2 + 11/1 + 11/1)$$
$$= 33\alpha$$

Figure 15:
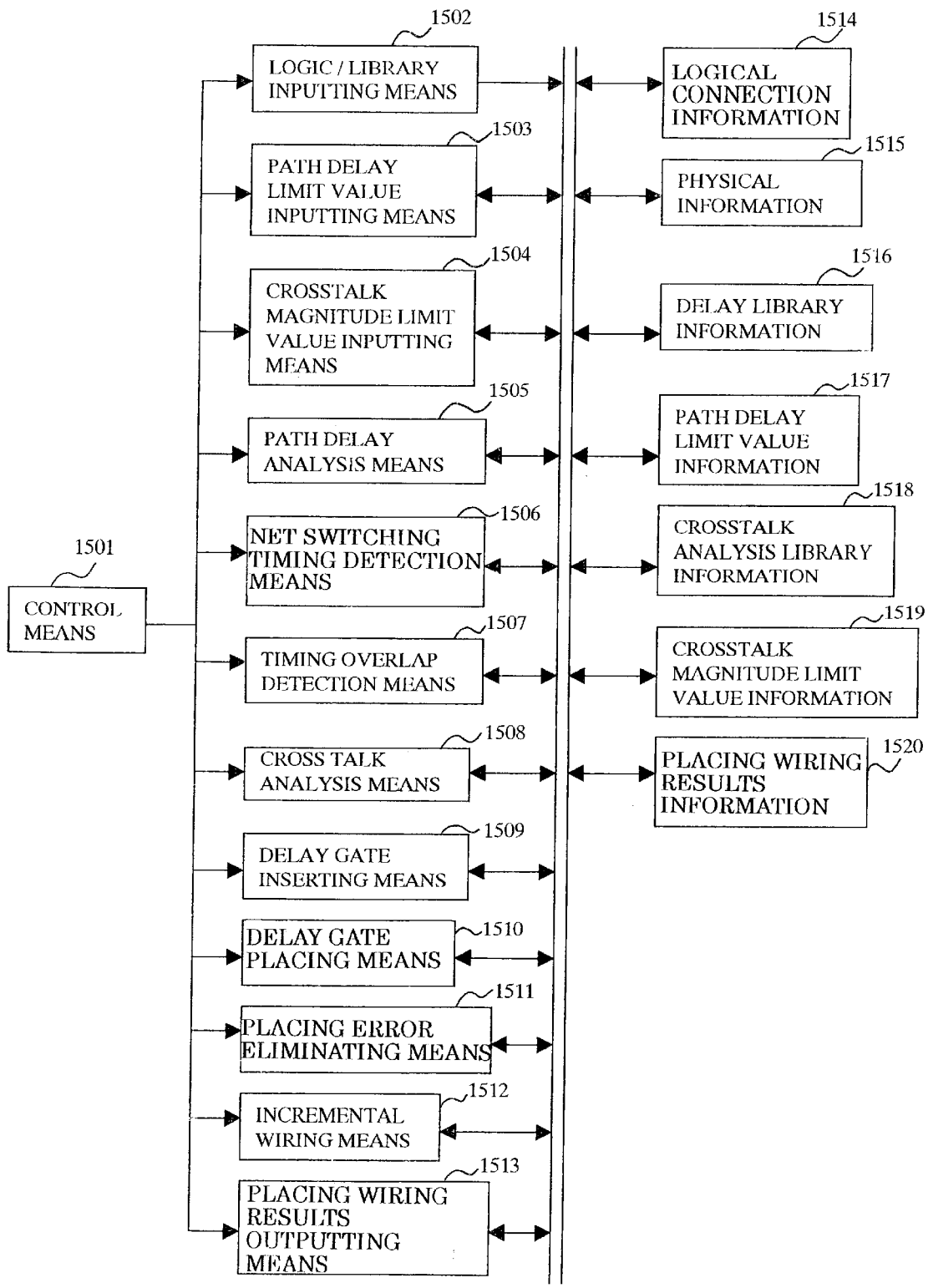
FIG. 15 is a block diagram of the crosstalk error improvement system according to the second embodiment of the present invention.

FIG. 15 shows a block diagram of a crosstalk error improving system according to the second embodiment of the present invention. The present second embodiment differs from the first embodiment in that there is newly provided placing error eliminating means 1511.

In the above-described first embodiment, if placing cannot be made for the delay gate placing candidate position, the delay gate placing means 110 (1510 of FIG. 15) searches for the near-by possible placing area. In the present second embodiment, the placing error is tolerated so that the delay gate is placed in the candidate position.

The placing error eliminating means 1511 then shifts the gate subjected to the placing overlap error, putting priority on the delay gate placing position, until the error is eliminated, and deletes the wiring results of the net connected to the shifted gate or those of the net giving rise to wiring shorting or contravention to the placing inhibition.

The wiring of the deleted net is performed by the incremental wiring means 1512.

Figure 16:
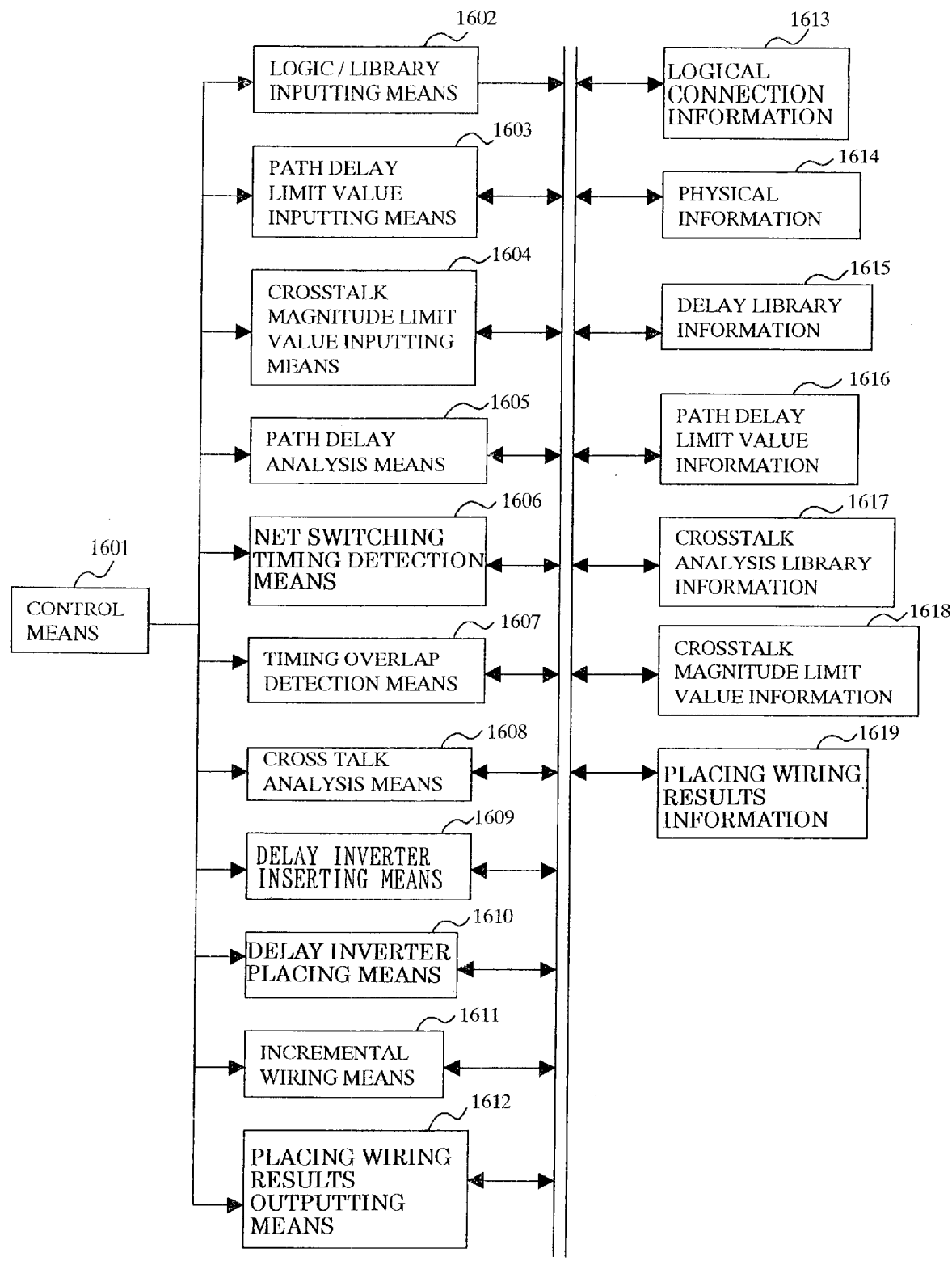
FIG. 16 is a block diagram of the crosstalk error improvement system according to a third embodiment of the present invention.
Figure 17:
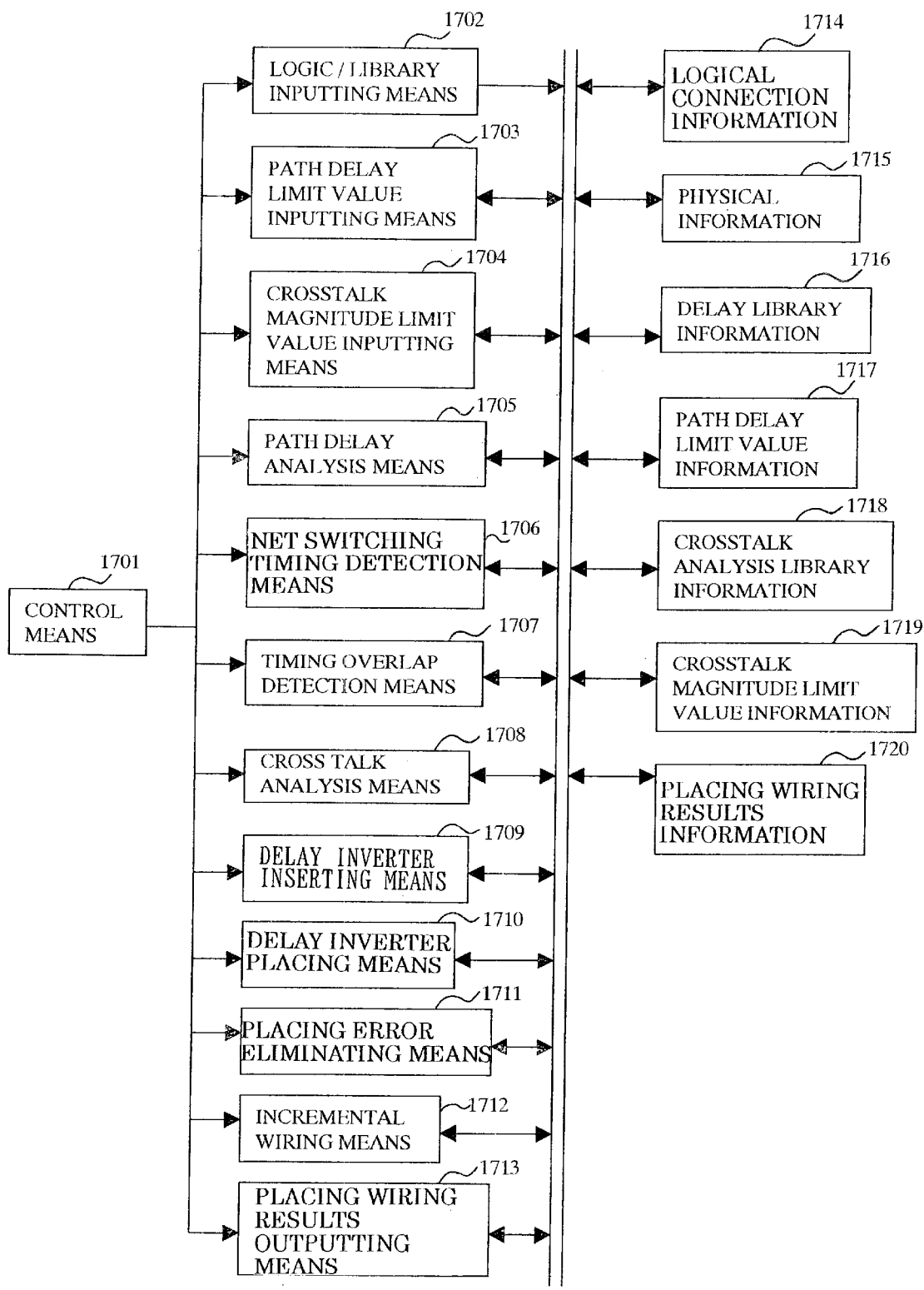
FIG. 17 is similarly a block diagram of the crosstalk error improvement system according to a third embodiment of the present invention.

FIGS. 16 and 17 show block diagrams of the crosstalk error improving system according to the third embodiment of the present invention. The difference between FIGS. 1 and 15 is that the delay gate inserting means (109 of FIG. 1 and 1509 of FIG. 15) and the delay gate placing means (110 of FIG. 1 and 1510 in FIG. 15) are replaced by delay inverter insertion means (1609 of FIG. 16 and 1709 of FIG. 17) and by delay inverter placing means (1610 of FIG. 16 and 1710 of FIG. 17), respectively.

In the present embodiment, it is an even number of inverters that are selected for improving the crosstalk error and inserted into the net on the path.

Figure 18:
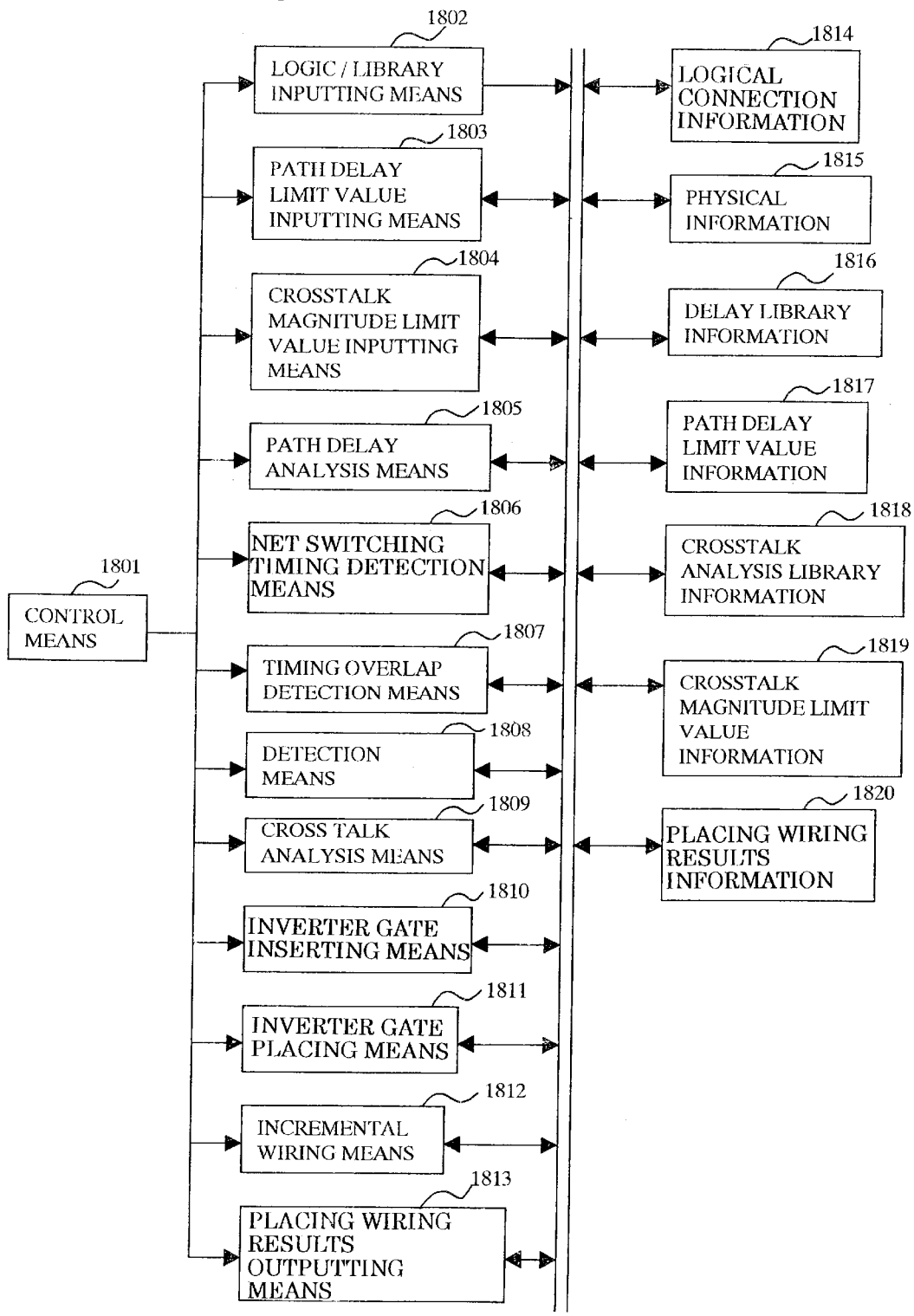
FIG. 18 is similarly a block diagram of the crosstalk error improvement system according to a fourth embodiment of the present invention.

FIG. 18 shows a block diagram of the crosstalk error improving system according to the fourth embodiment of the present invention.

Figure 10:
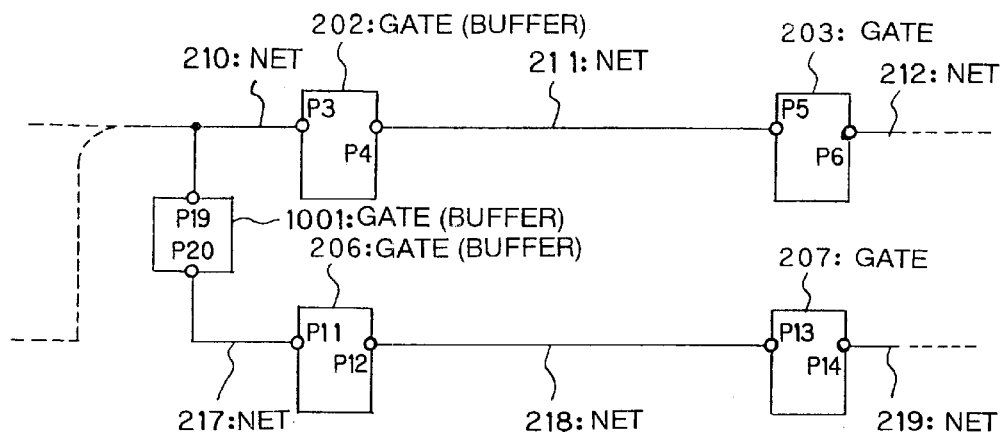
FIG. 10 illustrates a second embodiment of the present invention for showing an example of the logical connection information.

The following description is made with reference to the case in which the logic connection modified from the logic interconnection shown in FIG. 2 is as shown for example in FIG. 10 in which the net 218 is connected to the net 210 via a net 217 having a buffer gate 1001, and the nets 211, 218 are apparently operated at all times in the same direction (in a logic such as a buffer tree having buffer gates 1001 and 206, there is such logic which apparently operates at all times in the same direction as shown in the drawing).

As an example of the results of placing wiring processing employing the conventional layout technique, an error occurs with the crosstalk magnitude V211 applied to the net 211=48α (limit value: 40α) in FIG. 3.

In the crosstalk error improving system of the present embodiment, explanation of the operation of the means 1801 to 1807 of FIG. 18 is omitted, since the operation is similar to that of the means 101 to 107 of FIG. 1.

The crosstalk analysis means 1809 finds a peak value of the crosstalk magnitude from the neighboring net wiring segments) subjected to timing overlap, as shown in FIG. 5, in order to perform crosstalk error analysis for all nets, in such a manner that the crosstalk magnitudes for neighboring nets having perpetually different signal switching directions will not be summed by the detection means of the same direction net 1808. As the result of the crosstalk analysis, crosstalk errors of the net 211 are detected.

The present embodiment differs from the above-described first embodiment in that detection means of the same direction net 1808 detects that the net 218 (wiring segments 307, 308) operate at all times in the same direction as the net 211.

Then, for reducing the crosstalk magnitude to the net 211 subjected to the crosstalk error, the inverter gate inserting means 1810 of FIG. 18 selects the net switching at all times in the same direction as the net 211, from the neighboring nets affected by crosstalk, in order to insert an even number of inverter gates into the net.

Figure 11:
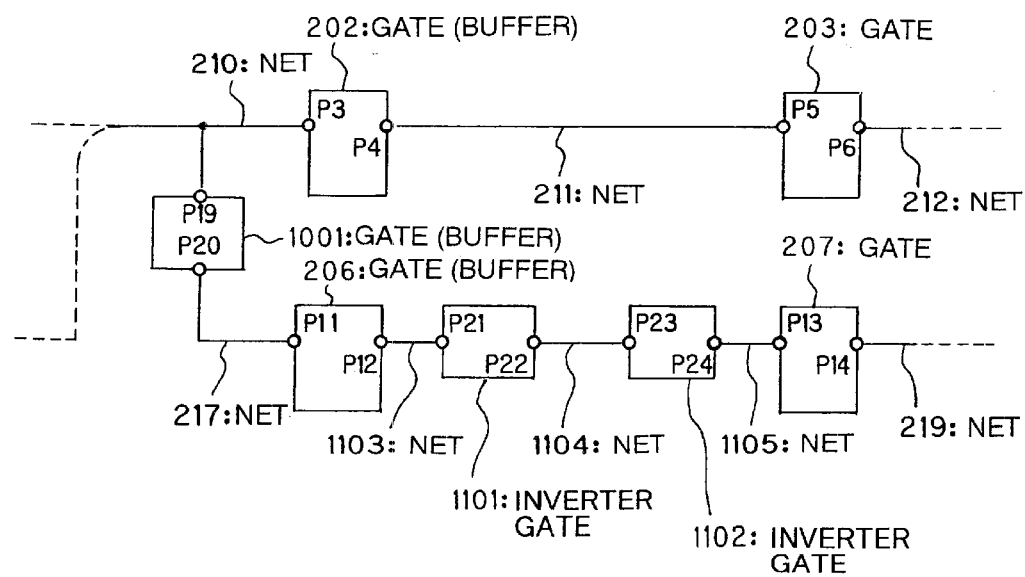
FIG. 11 illustrates the second embodiment of the present invention for showing an example of the logical connection information of the results of insertion of inverter gates by inverter gate insertion means.

In the embodiment of FIG. 11, two inverter gates 1101, 1102 are inserted into the net 218 of FIG. 10, which is thereby divided into 1103, 1104 and 1105. This net selection and inverter gate inserting operations are repeated until the error is eliminated. At this time, the insertion operation is carried out simultaneously with verification by the path delay analysis means 1805 (FIG. 18) such as to avoid contravention of the path delay time limitation by the inverter gate insertion. Although the logical connection information 1814 is updated based on the results of insertion, the route information of the wiring segments 307, 308 and 309 (FIG. 3), which stand for the results of wiring of the net 218, is kept in the placing wiring result information (memory) 1820.

Figure 12:
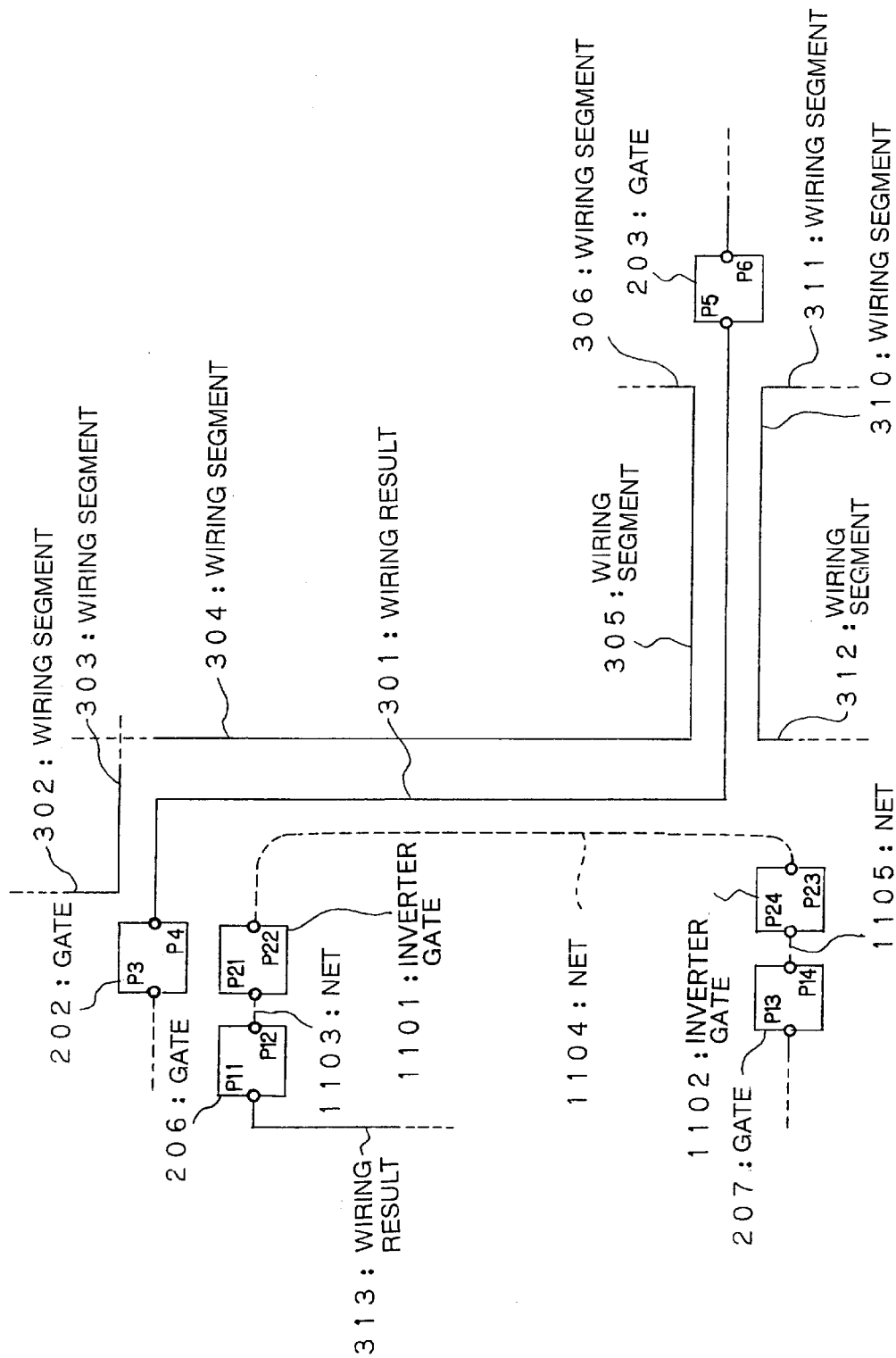
FIG. 12 illustrates the second embodiment of the present invention for illustrating an example of arraying of the inverter gates by the inverter gate arraying means.

The inverter gate placing means 1811 places the inverter gates 1101, 1102, inserted by the inverter gate inserting means 1810, in the possible placing area in the vicinity of the insertion candidate position on the wiring route of the deleted net 218, held on memory, to give the placing results of the inverter gates 1101, 1102, as shown in FIG. 12. The insertion candidate positions in this case are such positions as sandwich the wiring segment which applies the effect of crosstalk to the net 211 on the wiring route of the net 218 (FIG. 10). The insertion candidate positions can cancel the effect of crosstalk caused by the wiring segment by logic inversion.

In the example of FIG. 12, there is no wiring of another net in the arraying positions of the inverter gates 1101, 1102. However, if it does exist, such wiring as causes wiring shorting or wiring inhibition contravention is deleted simultaneously.

Figure 13:
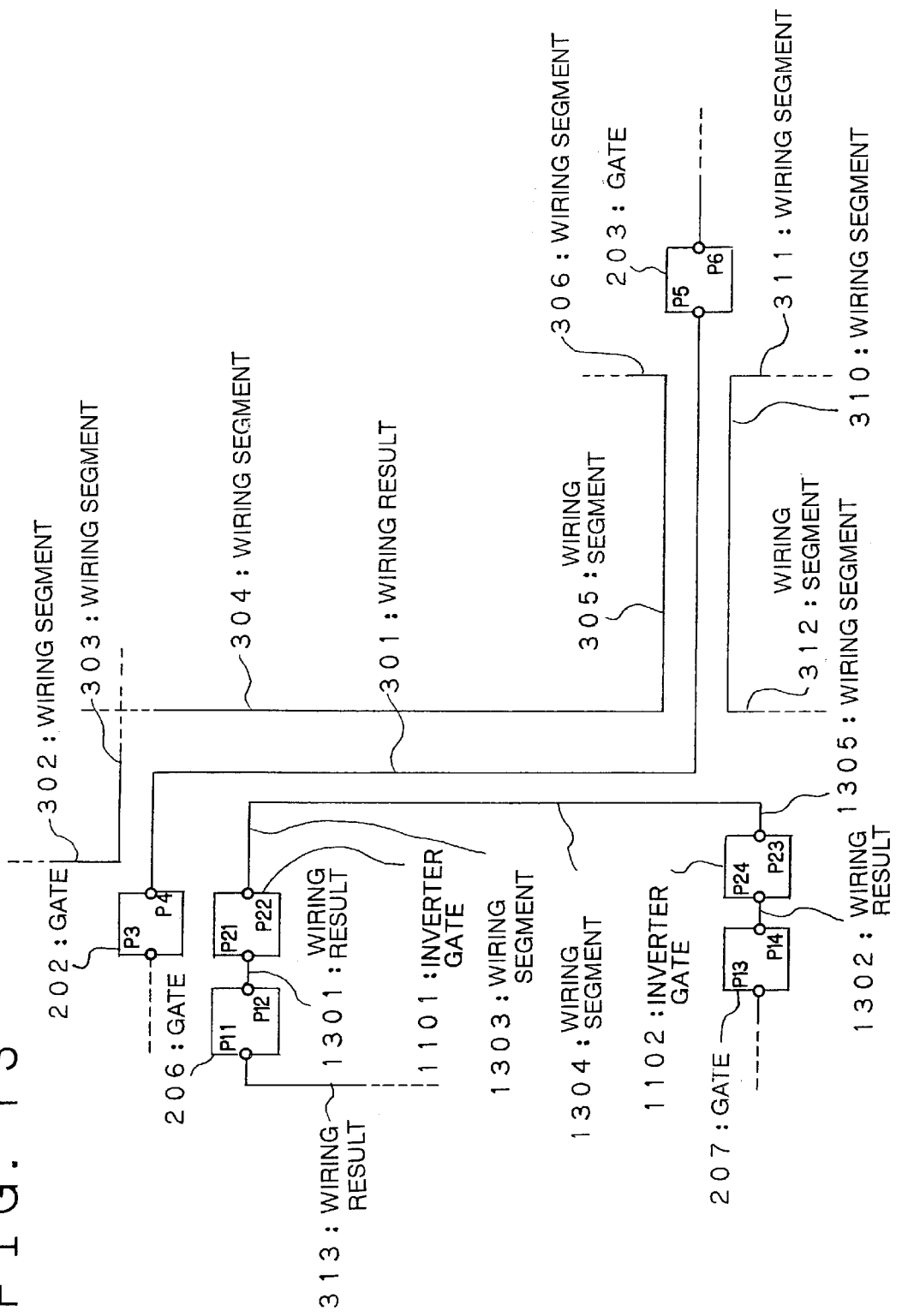
FIG. 13 illustrates the second embodiment of the present invention for illustrating an example of wiring results by incremental wiring means for the placing results of FIG. 12.

As a net in the non-wired state, the incremental wiring means 1812 of FIG. 18 performs wiring of nets 1103, 1104 and 1105 to give targeted wiring results 1301, 1302 and wiring segments 1303, 1304 and 1305 in which the crosstalk is improved or eliminated, as shown in FIG. 13.

Figure 14:
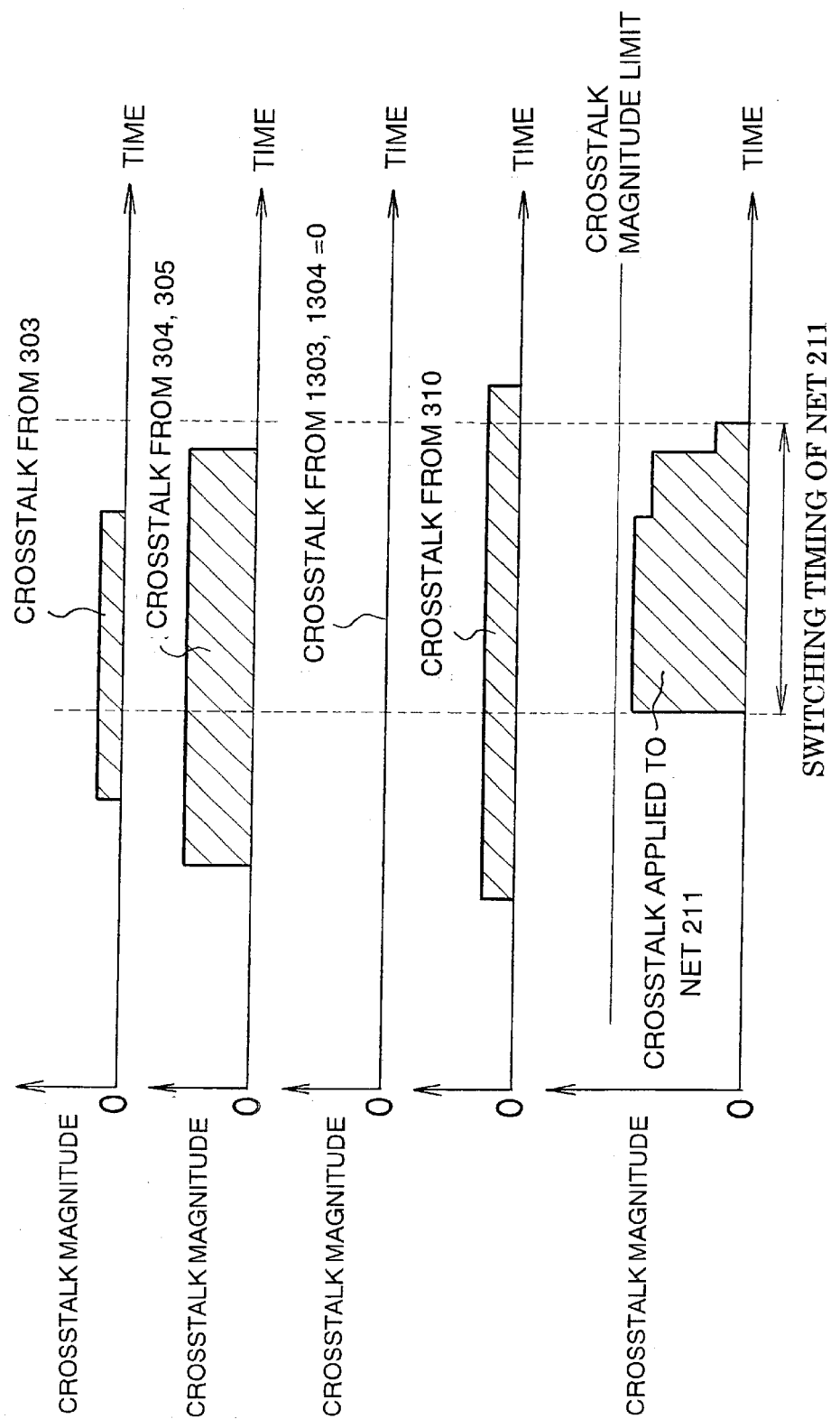
FIG. 14 illustrates an embodiment of the present invention for showing the switching timing of neighboring nets and the crosstalk from the neighboring nets in the wiring results of FIG. 13 versus the switching timing and crosstalk of the net under inspection.

FIG. 14 shows the magnitude of the crosstalk applied to the net 211 and the switching timing in the placing wiring results shown in FIG. 13. It is seen that the logic is inverted by the inserted inverter gates 1101, 1102 and the effect of the crosstalk of the wiring segments 1303, 1304 of FIG. 13 (equivalent to 307, 308 of FIG. 3) becomes zero with the maximum value of the crosstalk applied to the net 211 being as indicated by the following equation (8):

$$V211 = \alpha \cdot (L303/W303 + L304/W304 + \quad \quad (8)$$
$$L305/W305 + L310/W310)$$
$$= \alpha \cdot (3/1 + 16/2 + 11/1 + 11/1)$$
$$= 33\alpha$$

which is below the limit crosstalk magnitude of 40α so that the error is eliminated.

Figure 19:
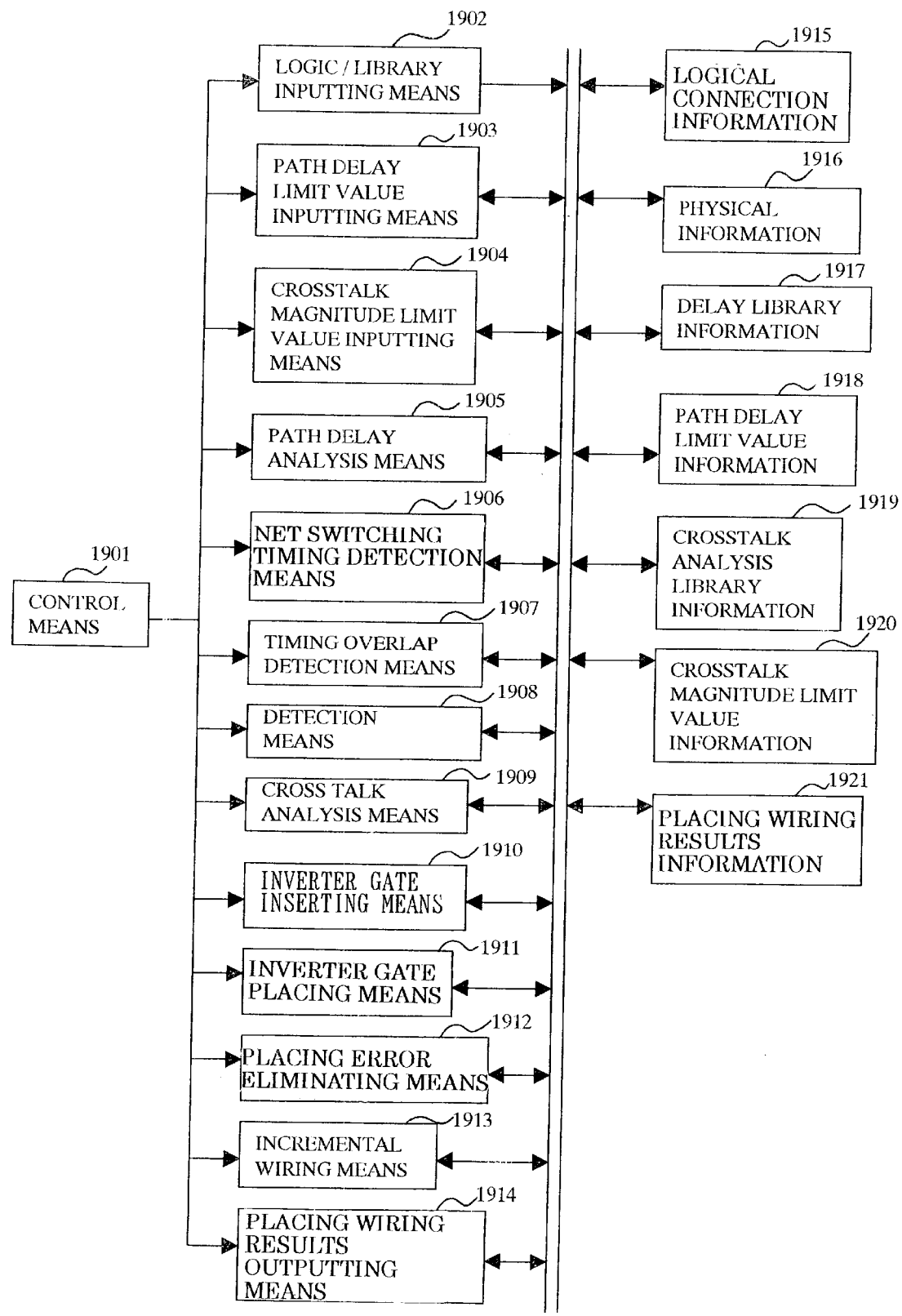
FIG. 19 is similarly a block diagram of the crosstalk error improvement system according to a fifth embodiment of the present invention.

FIG. 19 shows a block diagram of the crosstalk error improvement system according to the fifth embodiment of the present invention. The difference from the fourth embodiment shown in FIG. 18 is the addition of the placing error eliminating means 1912.

In the above-described fourth embodiment, if the inverter gate placing means 1911 (1811 of FIG. 18) cannot be placed at the inverter gate candidate position, search is made for a possible near-by placing area. In the preset embodiment, the placing error is tolerated and the inverter gate candidate position is placed in the candidate position.

Then, the placing error eliminating means 1912 places priority on the placing position of the inverter gate and shifts the placing position of the gate subjected to a placing overlap error until the error is eliminated to delete the wiring results of the nets connected to the shifted gate and/or the wiring results of the nets shifting of which gives rise to the wiring shorting or arraying inhibition error. The wiring of the deleted net is performed by the incremental wiring means 1913.

It is selfexplanatory in the art even without detailed explanation that the above entire processings, steps and/or procedures can be carried out in a computer system. The computer system comprises a CPU, a memory module, input module and an output module such as display. The memory module may comprise a register and a hard or permanent memory device such as hard disc etc.

The meritorious effect of the present invention are summarized as follows.

The present invention gives rise to the following results:

The first effect of the present invention is that the placing wiring results having the improved crosstalk error can be achieved automatically.

The reason is that net operating timing detection means finds from the results of the delay analysis by the path delay analysis means, the switching timing of each net, and timing overlap detection means detects, for all or part of the nets (nets under detection), an overlap of the switching timing between the net(s) under detection and neighboring net(s). On the other hand, the crosstalk analysis means calculates, using the library information for crosstalk analysis, the crosstalk magnitude to the net(s) under detection from the neighboring net(s) having timing overlap as detected by the timing overlap detection means for detecting the net subjected to the crosstalk error, and delay gate insertion means inserts at least one delay gate capable of satisfying the delay time limitations of a path to which belong the neighboring nets. The delay gate means can eliminate the timing overlap with the nets under inspection having timing overlap with a net under inspection undergoing crosstalk error as detected by crosstalk analysis by the crosstalk analysis means or a net on a path to which belongs the neighboring net having timing overlap with the net under inspection for reducing the crosstalk magnitude or of dissolving crosstalk error for improving the crosstalk error. In addition, delay gate placing means lays the delay gate inserted into the neighboring net or in the net on the path to which belongs the neighboring net by the delay gate inserting means at a position on the route of the real wiring results of the net or at a position on the route of the real wiring results of the net or in the near-by possible placing position, the positions being capable of improving the crosstalk error with the net under inspection, and incremental wiring means makes re-wiring of the net divided by the inspection and placing of the delay gate and other nets affected by the delay net insertion or placing, that is liable to cause designing rule errors such as wiring shorting.

The second effect of the present invention is that the worsening of the wiring acceptability by the addition of the gate(s)/and/or/inverters inserted for improving the delay error or an increased power consumption can be minimized.

The reason is that only gates/inverters necessary for improving the crosstalk error are inserted.

The third effect of the present invention is that the time required for improving the crosstalk error is short such that no new crosstalk error is produced.

The reason is that the incremental placing wiring processing is performed for the initial layout results so that the processing time is increased to a lesser extent to enable the crosstalk error to be improved to high accuracy.

The fourth effect of the present invention is that the pseudo error can be precluded to enable improvement of crosstalk error to a higher accuracy.

The reason is that detection and improvement of the crosstalk error taking into account the switching timing/operating direction of the signal are achieved automatically.

It should be noted that modification obvious in the art may be done without departing the gist and scope of the present invention as disclosed herein and claimed hereinbelow as appended.

What is claimed is:

1. A crosstalk error reducing system comprising:
    logical/library inputting means for inputting information including:
    1.) logical connection information between a plurality of blocks making up a circuit,
    2.) physical information of a block placing results and/or inter-block connection wiring results,
    3.) delay library information comprising parameters for calculating said block's internal delay and/or wiring delay required for delay analysis, and
    4.) library information for crosstalk analysis comprising parameters for calculating crosstalk magnitude required for crosstalk analysis;
    path delay limit value inputting means for inputting path delay time limit values, wherein the time limit values comprises minimum delay time limitation and/or maximum delay time limitation, prescribing a target performance of the circuit;
    crosstalk magnitude limit value inputting means for inputting a crosstalk magnitude limit value of a net for assuring normal circuit operation;
    path delay analysis means for performing delay analysis on at least one path;
    net switching timing detection means for finding, from a results of the delay analysis the time during which net switching is likely to occur, by determining a minimum/maximum time between a clock input time and a signal propagation to a net;
    timing overlap detection means for detecting, for all or part of the net, referred to as a "net under detection", an overlap of the switching timing between the net under detection and a net having a wire that neighbors the wire of the net under detection, referred to as "neighboring net";
    crosstalk analysis means for calculating, using the library information for crosstalk analysis, crosstalk magnitude to the net under detection from the neighboring net having timing overlap as detected by the timing overlap detection means thus detecting the net subjected to the crosstalk error;
    delay gate inserting means for inserting at least one delay gate, into the net subject to crosstalk as detected by the crosstalk analysis means or into a net on a path which belongs to the neighboring net which has a timing overlap with the net under detection so as to eliminate the timing overlap, said delay gate thus satisfies the delay time limitations of the neighboring net for reducing the crosstalk error;
    delay gate placing means for placing the delay gate, inserted either into the neighboring net or into the net on the path which belongs the neighboring net, at a position on the route of the real wiring result of the net or at a near-by possible placing position, wherein the position reduces the crosstalk error with the net under detection;
    incremental wiring means for re-wiring the net divided by the insertion and placement of the delay gate wherein the incremental wiring means also rewires other nets affected by the insertion and placement of the delay gate;
    outputting means for outputting a placing wiring results; and
    control means for controlling all of said means.

2. The crosstalk error reducing system as defined in claim 1 further comprising:
    a delay buffer placing means for placing the delay gate inserted by said delay gate inserting means at a position wherein the position reduces the crosstalk error in an overlapping manner, instead of searching for a near-by possible placing position; and placing error eliminating means for shifting the placing of the block to eliminate the overlap in case the delay gate placed by said delay gate placing means undergoes a placing error.

3. The crosstalk error reducing system as defined in claim 1 wherein:

said delay gate inserting means comprises a means for selecting, inserting, placing and wiring a plurality of stages of delay inverter gates as a set instead of said delay gate.

4. The crosstalk error reducing system as defined in claim 2, wherein said delay gate inserting means comprises means for selecting, inserting, placing and wiring a plurality of stages of delay inverter gates as a set instead of said delay gate.

5. The crosstalk error reducing system as defined in claim 1 comprising:

a same-direction-switching net detection means for detecting the neighboring net having a timing overlap with the net under detection, wherein the neighboring net is switched at all times in the same direction as the net under detection;

inverter gate inserting means for inserting a plurality of inverter gates in the neighboring net detected by said same-direction-switching net gate detection means;

inverter gate placing means for placing the inverter gate, inserted into the neighboring net by the inverter gate inserting means, at at least one position representing a starting point and ending point of a parallel wiring domain with the net under detection on the route of the real wiring results of the net or in the near-by possible placing position; and incremental re-wiring means for re-wiring the wiring of a net divided by the insertion and placement of said inverter gate and the wiring of other nets affected by the insertion and placement of the inverter gate.

6. The crosstalk error reducing system as defined in claim 5 comprising:

an inverter gate placing means for placing the inverter gates, inserted into the neighboring net by the inverter gate inserting means, at lease one position representing the starting point and ending point of the parallel wiring domain with the net under detection on the route of the real wiring results of the net or in the near-by possible placing position, provided that said inverter gate placing means places the inverter gate with an overlap to allow for placing error without searching for a near-by possible placing position even if other blocks are present in the intended placing position; and a placing error eliminating means for shifting the placing of a block for eliminating an overlap if the inverter gate placed by said inverter gate placing means undergoes a placing error.

7. A crosstalk error reducing system comprising:

means for detecting a switching timing of each net, to execute a crosstalk analysis that takes into account an overlap of the switching timing of a net under detection with a neighboring net, wherein said means for detecting said switching timing includes:

a path delay analysis means for performing a delay analysis of a plurality of paths;

a crosstalk analysis means for calculating a crosstalk magnitude of said net having a time switching overlap with said neighboring net;

means for inserting a delay gate into a neighboring net having a timing overlap with the net under detection, wherein the neighboring net is subject to crosstalk error with a net under detection or with a net on a path that belongs to the neighboring net, and wherein said delay gate reduces the crosstalk error without causing a path delay error;

means for placing the inserted delay gate at a position on a route of the net to reduce the crosstalk error of the net under detection; and means for re-wiring the net divided by the insertion of the delay gate in an affected net.

8. A crosstalk error reducing method comprising:

detecting switching timing of each net, to execute crosstalk analysis that takes into account an overlap of the switching timing of the net, under detection with a neighboring net, said detecting switching timing includes:

performing a delay analysis of a plurality of paths;

calculating a crosstalk magnitude of said net having a time switching overlap with said neighboring net;

inserting a delay gate into a neighboring net that has a timing overlap with a net under detection undergoing crosstalk error or with a net on a path that belongs to the neighboring net, whereby said delay gate reduces crosstalk error without causing a path delay error;

placing the inserted delay gate at a position on a route of the net to reduce the crosstalk error of the net under detection; and re-wiring the net divided by inserting the delay gate and an affected net.

9. A recording medium having recorded thereon a program designed for reducing crosstalk by executing on a computer a process comprising:

detecting switching timing of a net, to execute crosstalk analysis that takes into account an overlap of the switching timing of a net under detection with a neighboring net, said detecting switching timing includes:

performing a delay analysis of a plurality of paths;

calculating a crosstalk magnitude of said net having a time switching overlap with said neighboring net;

inserting a delay gate into the neighboring net having a timing overlap with the net under detection undergoing crosstalk error or with a net on a path that belongs to the neighboring net, wherein said delay gate reduces the crosstalk error without causing a path delay error;

placing the inserted delay gate at a position on a route of the net to reduce crosstalk error of the net under detection; and re-wiring the net divided by inserting the delay gate in an affected net.

10. A computer system comprising a CPU, a memory module, an input module and an output module, wherein said program defined in claim 9 has been recorded in said memory module.

11. A crosstalk error reducing apparatus comprising:

a detection unit for detecting a net having a time switching overlap with at least one neighboring net, wherein said detection unit includes:

a path delay analysis unit for performing a delay analysis of a plurality of paths;

a crosstalk analysis unit for calculating a crosstalk magnitude of said net having a time switching overlap with said neighboring net;

a selection unit for selecting said net affecting said neighboring net with said time switching overlap;

an inserting unit for inserting a delay gate into at least one of a net under detection and a wiring route of said neighboring net; and a wiring unit for re-wiring said neighboring net divided by the insertion of said delay gate.

12. A computer aided design system capable of performing crosstalk error reduction comprising:

a user interface for entering a circuit schematic wherein said circuit schematic includes information representing circuit elements and a plurality of inter-connections between said circuit elements;

a simulation module coupled to said user interface wherein said simulation module executes a crosstalk error reduction program utilizing layout information from a neighboring net, wherein the simulation module includes:

a detection means for detecting a net having a time switching overlap with at least one neighboring net, wherein said detection means includes:

a path delay analysis means for performing a delay analysis of a plurality of paths; and a crosstalk analysis means for calculating a crosstalk magnitude of said net having a time switching overlap with said neighboring net;

a selection means for selecting said net affecting said neighboring net with said time switching overlap;

inserting means for inserting a delay gate into a wiring route of said neighboring net, wherein said delay reduces crosstalk error without causing a path delay error; and a wiring means for re-wiring said neighboring net divided by the insertion of said delay gate.

* * * * *

UNITED STATES PATENT AND TRADEMARK OFFICE
CERTIFICATE OF CORRECTION

PATENT NO. : 6,405,350 B1
DATED : June 11, 2002
INVENTOR(S) : Shigeyoshi Tawada

It is certified that error appears in the above-identified patent and that said Letters Patent is hereby corrected as shown below:

Column 8,
Line 49, delete "i f ($\Sigma$ Cj) = $\beta \cdot \Sigma$ Cj" and insert -- f ($\Sigma$ Cj) = $\beta \cdot \Sigma$ Cj --;
Line 60, delete "+ tm"

Column 16,
Lines 17 and 18, "said detecting switching timing includes:" and insert -- wherein said means for detecting switching timing of each net includes: --;
Line 40, delete "said detecting switching timing includes:" and insert -- wherein said means for detecting switching timing of each net includes: --

Signed and Sealed this

Fifth Day of November, 2002

Attest:

Attesting Officer

JAMES E. ROGAN
*Director of the United States Patent and Trademark Office*